United States Patent [19]

Cheng et al.

[11] Patent Number: 5,774,081

[45] Date of Patent: Jun. 30, 1998

[54] APPROXIMATED MULTI-SYMBOL ARITHMETIC CODING METHOD AND APPARATUS

[75] Inventors: Joe-Ming Cheng, Cupertino; Glen George Langdon, Jr., Aptos, both of Calif.

[73] Assignee: International Business Machines Corporation, Armonk, N.Y.

[21] Appl. No.: 574,098

[22] Filed: Dec. 11, 1995

[51] Int. Cl.$^6$ .................................................. H03M 7/00
[52] U.S. Cl. ............................................................ 341/107
[58] Field of Search ............................... 341/107, 65, 88, 341/106, 67, 50, 59

[56] References Cited

U.S. PATENT DOCUMENTS 5,227,789  7/1993  Barry et al. ............................... 341/65

OTHER PUBLICATIONS

G.G. Langdon, "Adaptation to Binary Sources: Monte Carlo and Q Coder Approaches", IBM Research Journal, Nov. 1990.
R. B. Arps et al., "Control Characte Insertion Into Arithmeically Encoded Strings", IBM Technical Disclosure Bulletin, Sep. 1982, pp. 2051–2052.
D. R. Helman et al., "Statistics Collection For Compression Coding With Randomizing Feature", IBM Technical Disclosure Bulletin, Mar. 1982, p. 4917.
G. G. Langdon, "Embedding Prefix Codes Into Arithmetic Codes", IBM Technical Disclosure Bulletin, May 1984, pp. 5966–5969.
B. L. Marks, "Trimming Of Huffman Coding Tables", IBM Technical Disclosure Bulletin, Oct. 1979, p. 2106.
T. C. Bell et al., Text Compression, Prentice Hall, 1990, pp. 105–112.
D. A. Huffman, "A Method for the Construction of Minimum–Redundancy Codes", Proceedings of the I.R.E., Vo. 40, No. 9, Sep. 1952, pp. 1098–1101.
G. G. Langdon, Jr. et al. "Hardware–Optimized Compression and the Skew Coder LSI Chip", Research Report, Computer Science, Feb. 6, 1992, pp. 1–17.
I. H. Witten et al., "Arithmetic Coding For Data Compression", Communications of the ACM, vol. 30, No. 6, Jun. 1987, pp. 520–540.
G. G. Langdon, Jr., "Compression of Black–White Images With Arithmetic Coding", IEEE Transactions On Communications, vol. COM–29, No. 6, Jun. 1981, pp. 858–867.

*Primary Examiner*—Brian K. Young
*Attorney, Agent, or Firm*—G. Marlin Knight

[57] ABSTRACT

A method and apparatus for compressing and decompressing data is described. The most frequent symbols (A-Group.) are encoded using an Arithmetic Code, then the remainder of the symbols (H-Group) are first encoded using Huffman's algorithm (or any Prefix code) and then combined with the Arithmetic code resulting in a hybrid Arithmetic/Huffman code. After being encoded into a Huffman code, the H-Group symbols are made into a "super-symbol" which fits into an Arithmetic subinterval allocated to the symbols in the H-Group. The Arithmetic subintervals for the symbols in the H-Group preferably are a negative power of 2 (e.g., ½, ¼, 1/16, 1/32, etc.) of the code space. Each such H-group subinterval has its own associated subset of H-group symbols comprising one Huffman code table that fits into that respective interval. Decoding in an AMSAC system first treats the code stream as Arithmetically encoded. Standard prior art Arithmetic decoding is performed until an interval assigned to the super-symbol(s) is encountered. The Arithmetic super-symbol for this interval is then processed to obtain the Prefix code by reversing the scaling and offsetting, if any, that was needed to fit the super-symbol into the assigned Arithmetic subinterval. The Prefix code is then decoded into the original symbol using standard prior art Prefix techniques.

62 Claims, 8 Drawing Sheets

APPROXIMATED MULTI-SYMBOL ARITHMETIC CODING METHOD AND APPARATUS

FIELD OF THE INVENTION

The invention described below relates to the field of methods and apparatus for encoding data into a compressed form and for decoding the compressed form.

BACKGROUND OF THE INVENTION

In order to make efficient use of communication channels and data storage devices, such as hard disk drives, floppy disks, optical disks, magnetic tape, etc., schemes have been developed for converting the data into a more compact or compressed form for storage or transmission. When the data is retrieved, it is decoded back into its original form.

Huffman and Shannon-Fano algorithms are well known ways to generate Prefix codes for compressing data. These Prefix codes are often referred to as Huffman or Shannon-Fano codes. Prefix codes are sometimes called Instantaneous codes. In the following the two terms will be used interchangeably. Huffman coding will be described briefly. The input data is viewed as messages which are composed of symbols with each symbol having a certain frequency of occurring. For example, in English language messages the symbols are "a", "b", "c", etc., and "z" has lower frequency of occurring in English messages than does "e". The set of possible symbols values is called the alphabet. The coding process has two phases: first a code book for the alphabet used in the message is created, then the symbols are replaced with the corresponding code from the code book. One way to form the code book is using a binary tree which is created with the most probable symbols having the shallower depth in the tree. The codeword for any symbol is then formed by building a string of bits which indicate how to traverse the tree to reach the leaf of the symbol. The more probable symbols will have shorter codes because fewer branches are required to reach them. Huffman codes have the "prefix property" which means that no code forms a prefix of another codeword.

Arithmetic coding is another well known compression coding system which has demonstrated efficiency and robustness over a wide range of applications including text, binary image and grey scale image. An Arithmetic coder that processes one symbol per unit of time out of possible m symbols, where $m=2^k$, is called a Multiple Symbol Arithmetic Coder (MSAC). In the ideal case $2^k$ MSAC improves coding throughput over $2^1$ MSAC codes by a factor of k. Efficient hardware and software to achieve good MSAC implementations for higher values of k have not been reported.

In Arithmetic coding a message is represented as an interval of real numbers typically between 0 and 1. The interval is divided into m subintervals which are allocated to the m symbols in proportion to their frequency of appearing in the unit of data being encoded. Thus, the most probable symbols are allocated the largest portion of the interval. To encode a symbol, the subinterval for that symbol is selected. The selected subinterval is then further subdivided into m subintervals in a recursive process to encode each of the following symbols. The subintervals are represented numerically. In order to allow Arithmetic coding to work properly in a finite precision environment, after each symbol is processed, the interval can be renormalized back to the original precision.

An Arithmetic coding interval used in the prior art is illustrated in FIG. 1. This example comes from "Arithmetic Coding for Data Compression", by Ian Witten, et al., Communications of the ACM, June 1987, Vol. 30, No. 6. The interval between 0 and 1 is allocated to the symbol alphabet "a", "e", "I", "o", "u" and "!" in proportion to their frequency of occurrence. The sequence of subintervals moving from left to right shows how the message "eaii!" would be encoded in this particular scheme. The first symbol "e" is allocated the interval from 0.2 to 0.5. For the second symbol "a", the interval for the prior part of the message (0.2 to 0.5) is subdivided according to same proportionate allocation of 0 to 1. The process is completed for each symbol in the message. The processing of the message progressively narrows the interval. Thus, after processing an "e" and an "a", the interval is 0.2 to 0.26. When the entire message is processed as shown in FIG. 1, the interval has been reduced to 0.23354 to 0.2336. Only the lower bound of 0.23354 is needed by the decoder to derive the original.

The prior art of Arithmetic coding has taught the use of registers known as the "C-Register"(C-Reg) and "A-Register" (A-Reg), for encoding and decoding pure Arithmetic codes. Their use is described in several published articles. (See for example, R. Arps, et al.,"A multi-purpose VLSI chip for adaptive data compression of bilevel images", IBM Journal of Research and Development, Vol. 32 No. 6, November 1988, pp. 775 ff.) Briefly, the A-Reg represents the width of the current interval while the C-Reg represents the lower endpoint of the current interval.

Huffman codes are relatively straight forward to implement and have been used extensively, but Arithmetic codes have a high computational complexity especially with a non-binary alphabet. Arithmetic codes are more efficient in general than Huffman codes. The worst case for Huffman codes is approached as the highest frequency of a single symbol occurring nears one hundred percent. The lower limit for Huffman codes is one bit per symbol, but Arithmetic codes can improve on this by a factor of ten even in practical applications such as black and white image compression. Therefore, it is important to develop new ways to implement Arithmetic codes as simply as possible. Prefix and Arithmetic coding arts have been considered to be distinct.

SUMMARY OF THE INVENTION

The invention is a method and apparatus for compressing and decompressing data which realizes the primary benefit of Arithmetic codes without the complexities of a complete implementation in a multisymbol application. The method will be referred to as Approximated Multiple Symbol Arithmetic Coding (AMSAC). The most frequent symbols (one or more) are encoded using an Arithmetic code, then the remainder of the symbols are first encoded using Huffman's algorithm (or any Prefix code) and then combined with the Arithmetic code resulting in a hybrid Arithmetic/Huffman code. In the following, wherever "Huffman" is used, any Instantaneous or Prefix code may be substituted. The symbol values (the alphabet) are divided into a first set (A-Group) containing one or more of the most frequently occurring symbol values and one or more second sets (H-Groups) containing the other symbol values. After being encoded into a Huffman code, H-Group symbols are made into a "super-symbol" which fits into an Arithmetic subinterval allocated to the symbols in the H-Group.

The sum of the sizes of the subintervals is the size of the full interval, i.e., the A-register code space. The Arithmetic subinterval(s) for the H-Group(s) preferably each take up a negative power of 2 (e.g., ½, ¼, ¹⁄₁₆, ¹⁄₃₂, etc.) of the A-register code space size. Each such H-group subinterval has its own associated subset of H-group symbols comprising one Huffman code table. Decoding in an AMSAC system typically treats the code stream as Arithmetically encoded. Standard prior art Arithmetic decoding is performed until an interval assigned to the super-symbol(s) is encountered. The Arithmetic super-symbol for this interval is then processed to obtain the Prefix codeword by reversing the scaling and offsetting, if any, that was needed to fit the super-symbol into the assigned Arithmetic subinterval. The Prefix codeword is then decoded into the original symbol using standard Prefix techniques.

DETAILED DESCRIPTION OF THE INVENTION

The invention is implemented in an encoder and a matching decoder either of which may be a software program, a hardware device or some combination thereof. The encoder has a statistical unit which provides the basis for partitioning the frequently occurring symbols into the A-Group set of symbols (which may range from the null set to the complete set of input symbols).

Figure 7:
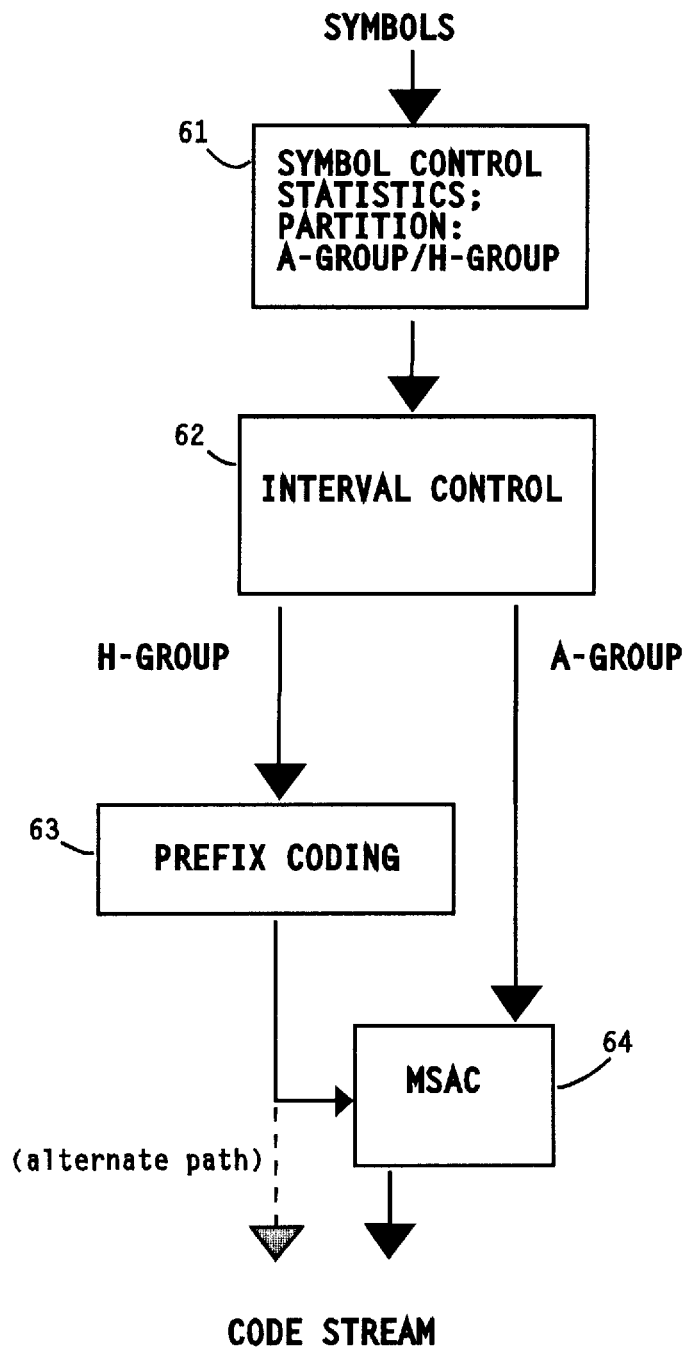
FIG. 7 illustrates the high level internal structure of a Approximated Multi-Symbol Coding System encoder implementing the invention.

FIG. 7 shows an overview of a possible encoding system embodying the invention. The allocation of the various functions into specific units is somewhat arbitrary for both the encoders and the decoders. To anyone skilled in the art it will immediately be obvious that functions may be moved between units, consolidated into fewer units and/or divided up among additional units. The Symbol Control 61 unit is responsible for gathering the statistics on the occurrences of the various members of the alphabet and for partitioning the symbols into the A-Group and the H-Group(s). The statistics can be gathered using any prior art technique such as a two pass approach making a first pass through the input data to accumulate the symbol counts or the statistics may also be accumulated on-the-fly in a one-pass approach where the relative frequencies are either updated immediately following the encoding (or decoding) of the symbol, or else delayed until some event known to both encoder and decoder. As is in the prior art, the symbol statistics must either be communicated to the decoder expressly or sufficient information must be sent to allow the decoder to deduce the statistics. The Interval Control 62 unit manages the subinterval assignments and determines whether the current subinterval is assigned to the A-Group or H-Group. The A-Group symbols are routed directly to the Multiple Symbol Arithmetic Coder (MSAC) 64 for Arithmetic encoding. The H-Group symbols are routed to the Prefix Coder 63 for Prefix encoding. The output of the Prefix Coder may be scaled and offset and then fed into the MSAC or it may be placed directly in the output code stream as will be discussed in greater detail below.

Although the entire AMSAC code stream is typically Arithmetically encoded, the subinterval assigned to the Huffman coded symbols will have unique properties that permit a simple way to encode and decode a large number of symbols in the H-Group when the H-Group subinterval is placed in the first position (i.e., lowest, leftmost or closest to 0) and the assigned subinterval width is a negative power of 2. (Note that in some implementations of the invention it is possible for units of data to be coded entirely in Huffman form if no symbol value has a sufficiently high frequency to make Arithmetic coding worthwhile). Grouping symbols into an H-Group considerably reduces the number of Arithmetic subintervals to be dealt with over ordinary Arithmetic coding where each symbol has its own subinterval. For example, if there are 256 symbols, and four of them are Arithmetically encoded and the rest are assigned to a single H-group, then the Arithmetic coder needs only to deal with a total of five Arithmetically encoded subintervals instead of 256 such subintervals. If, instead of the single H-group assigned to a single Huffman subinterval, the H-group is split into four pieces and created four Huffman subintervals, then the complexity would be increased from five Arithmetically encoded subintervals to eight Arithmetically encoded subintervals (four Arithmetically encoded symbols and four subgroups of the H-group). Unless otherwise specified, in what follows a single H-group subinterval assigned to all Huffman encoded symbols is assumed.

By encoding one or more symbols in Arithmetic form and the rest in the hybrid Arithmetic/Huffman code, the invention eliminates the worst case for standard Huffman coding. If there is a small set of symbols whose frequency is very high, it will be coded in Arithmetic form and, therefore, the efficiency of a pure Arithmetic code can be approached if not equaled. For example, if the most frequent symbol's relative frequency (which is the same as its probability as used herein) is far greater than 0.5, then a Huffman code will generate 10 to 100 times larger code output than an Arithmetic code. The invention also allows a substantial simplification of the hardware and software required for a standard Arithmetic code implementation. In practice, these benefits can be obtained by coding three to seven symbols in Arithmetic form. For distributions with a Most Probable Symbol probability greater than 0.7, even coding one symbol in Arithmetic form can result in substantial implementation benefits. For rapid decoding, the smaller the number of symbols coded Arithmetically, the smaller the number of parallel arithmetic units needed in the hardware. The boundary (cut-line or partition point) between the A-Group and the H-Group is preferably dynamically partitioned based on the actual content of the message. With dynamic partitioning, some messages could be coded all in a pure Arithmetic code, others could be coded all in the hybrid Arithmetic/Huffman code, while others could be coded in standard Huffman code. (A system which implemented the dynamic partitioning in an all-or-nothing fashion could produce code which was either all in a pure Arithmetic code or all in a Huffman code would also eliminate the worst case for the Huffman code).

In a practical implementation of the invention in a device such as a disk drive or disk drive controller, the units of data being compressed might be an entire track, a single record in a variable length record architecture, or a disk sector. The invention applies equally well to any appropriate unit of data. A purely software implementation of the invention on a general purpose computer is also possible.

The dynamic partitioning of the number of symbols to be coded in pure Arithmetic code form can be determined in any convenient way. For example, the twopass approach scans the unit of data once to determine the symbol statistics (i.e. symbol counts which gives the relative frequencies) and then assigns each symbol to one of the two sets accordingly. A one-pass, or on-the-fly, approach can count the symbols as they are processed and adjust the symbols assigned to each set accordingly.

Figure 1:
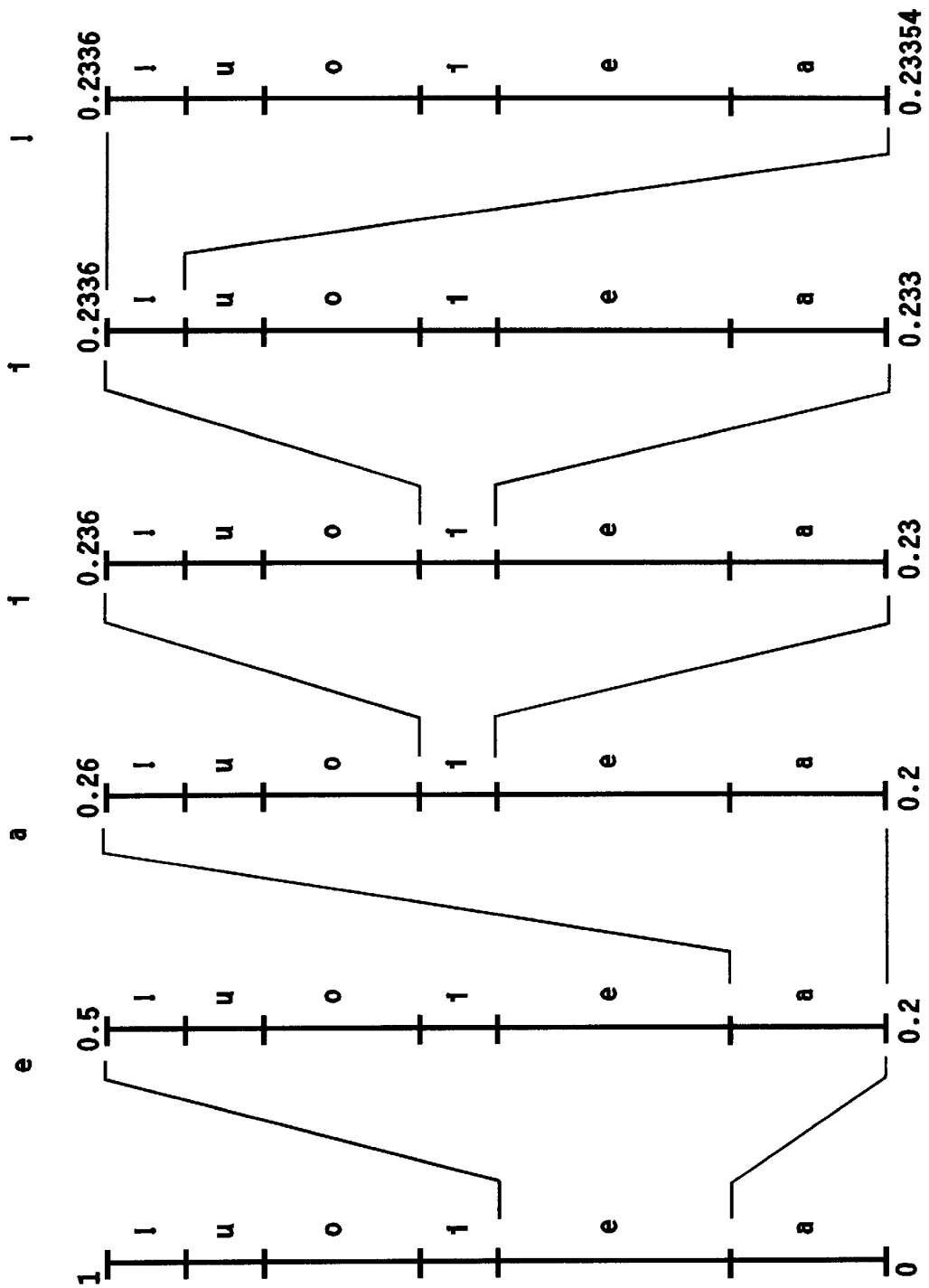
FIG. 1 illustrates the use of the interval in prior art Arithmetic coding.
Figure 2:
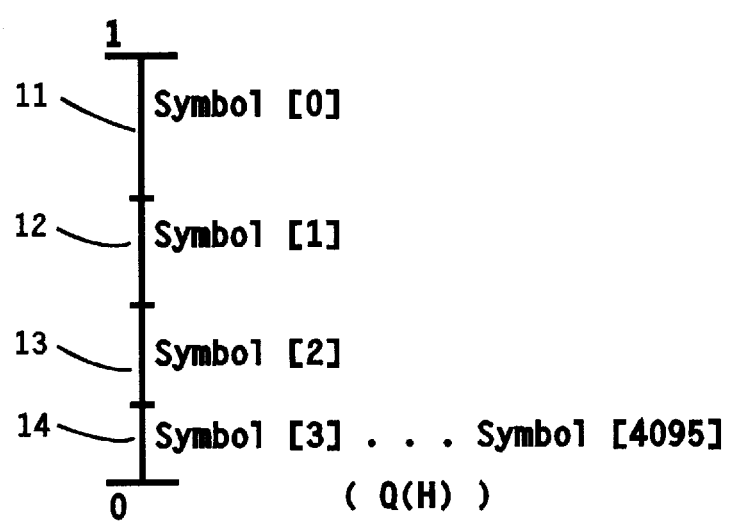
FIG. 2 illustrates the mapping of a Huffman interval on to an Arithmetic code interval per the invention.

Preferably, the invention allocates the Huffman codes to one subinterval in the Arithmetic interval, which forms the Huffman subinterval which acts as a kind of Arithmetic interval "super-symbol" representing the H-group. This is illustrated in FIG. 2. The alphabet in this case is [0 . . . 4095] which is a more realistic example than that used in FIG. 1. The full arithmetic interval in FIG. 2 is divided into four subintervals. The relative position of the subintervals forms a left to right ordering from 0 to 1 along the interval. The subinterval 11 assigned to the Symbol [0] is the largest. The subintervals 12 and 13 are assigned to Symbol [1] and Symbol [2] respectively. The Huffman subinterval 14 shown in FIG. 2 is that portion of the Arithmetic interval of size Q(H) assigned to the H-group Symbols [3] through [4095] which are encoded into a super-symbol.

Conceptually, the AMSAC encoding system partitions or divides the symbols into at least two distinct groupings: an A-Group and one or more H-Groups, then it encodes the symbols in the A-Group in Arithmetic form and encodes the symbols in the H-Group(s) using Hybrid Arithmetic-and-Prefix coding techniques. The Hybrid Arithmetic-and-Prefix encoding includes the following steps: a) before encoding construct the Prefix code, e.g. Huffman code; b) apply Huffman code scaling and summing with an H-Group offset to fit the complete prefix code in a designated H-Group subinterval (the result is called an augend); and c) encode the augend with Arithmetic coding. Each subinterval has a corresponding augend; thus, the augend for the leftmost subinterval is 0 and the rightmost subinterval has the largest augend. Each symbol in the H-Group is encoded into a Huffman codeword, then scaled and offset as necessary to fit into an Arithmetic subinterval. Scaling must always be performed but offseting is only required if there is an H-Group which is not the first subinterval which is necessarily the case when there are multiple H-Groups. The nature of binary addition will in some cases allow the scaling to be performed by simple concatenation as will be illustrated below.

Figure 3:
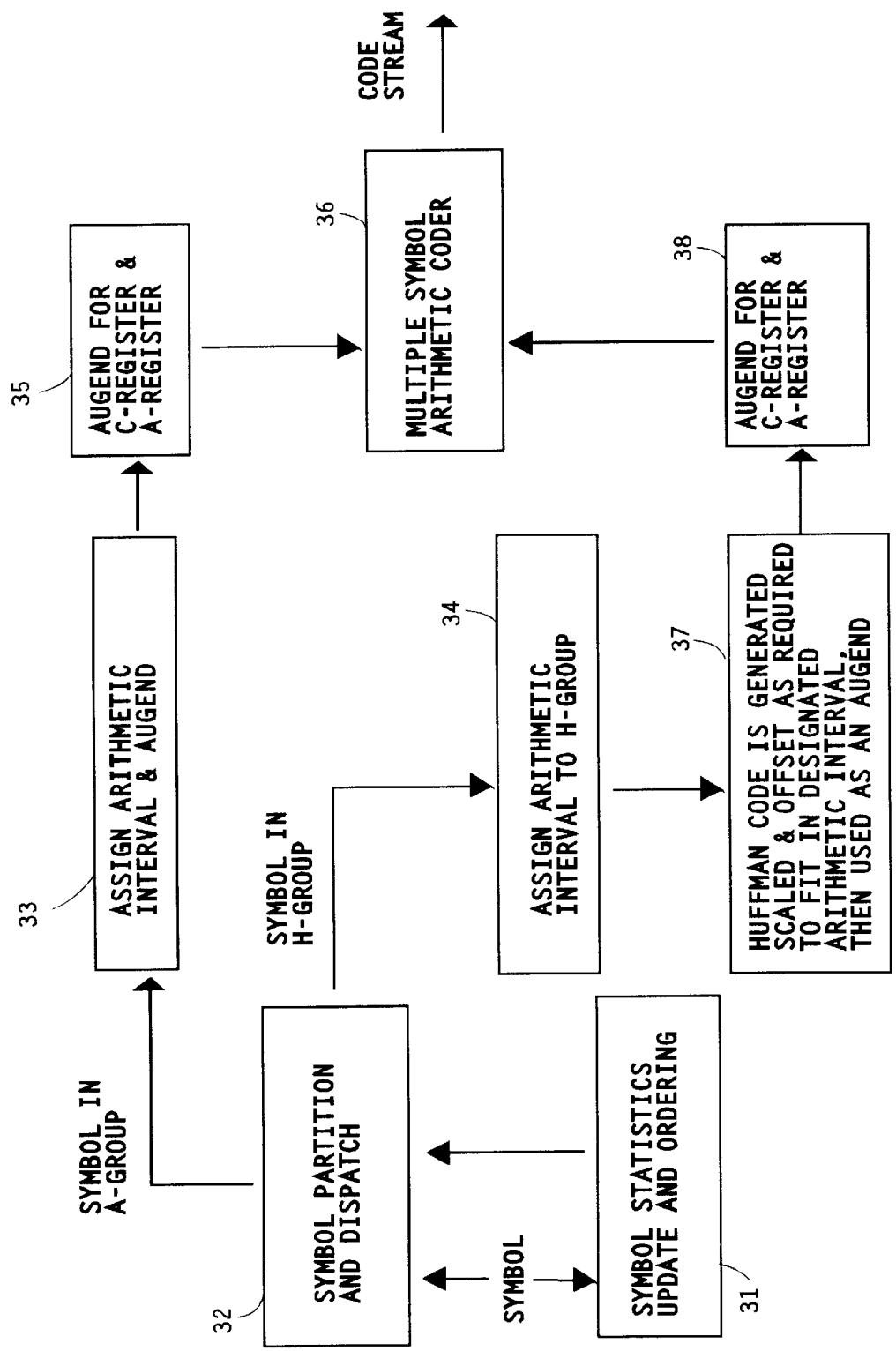
FIG. 3 illustrates the internal structure of a Approximated Multi-Symbol Coding System encoder implementing the invention.

FIG. 3 shows one possible embodiment of the AMSAC invention in an encoder. In FIG. 3 the statistics on the symbols are gathered and updated as required by the Symbol Statistical Update and Ordering Unit (SSUO) 31. The Symbol Partition and Dispatch Unit 32 is responsible for dividing the symbols into the A-Group and the H-Group and for routing the symbol to the correct place for processing. Symbols in the A-Group are routed to have the Arithmetic subinterval and augend assigned for the symbol in element 33. The H-Group symbols are routed to have the Arithmetic subinterval assigned for the H-Group in element 34. The augend generated in element 34 is loaded into the A-reg and the C-reg in element 35. The output of element 35 is one of two inputs going into the Multiple Symbol Arithmetic Coder 36. The output of element 34 is used by element 37 to generate the Huffman code then scale it (and offset it if required). The scaling is required to make the Huffman code fit into the Arithmetic interval. The coding operation can be done in a two step procedure by first encoding the super-symbol (including its renormalization), adding the codeword to the codestring, then renormalizing according to the codeword length. In the second step the codeword is added to the codestring with the leading bit aligned with the 0.1 binary position. Offsetting is required if there is more than one H-Group. The result of this process is then used as an augend in element 38 for the C-Reg and then the A-Reg and the C-Reg are renormalized. The output of element 38 forms the second input into the Multiple Symbol Arithmetic Coder 36. The output of the Coder 36 is the code stream.

A matching decoder will be used to convert the output of the encoder back into its original non-compressed form. The size of intervals is some optimized fit proportional to the symbol frequency of Huffman group frequency.

Figure 4:
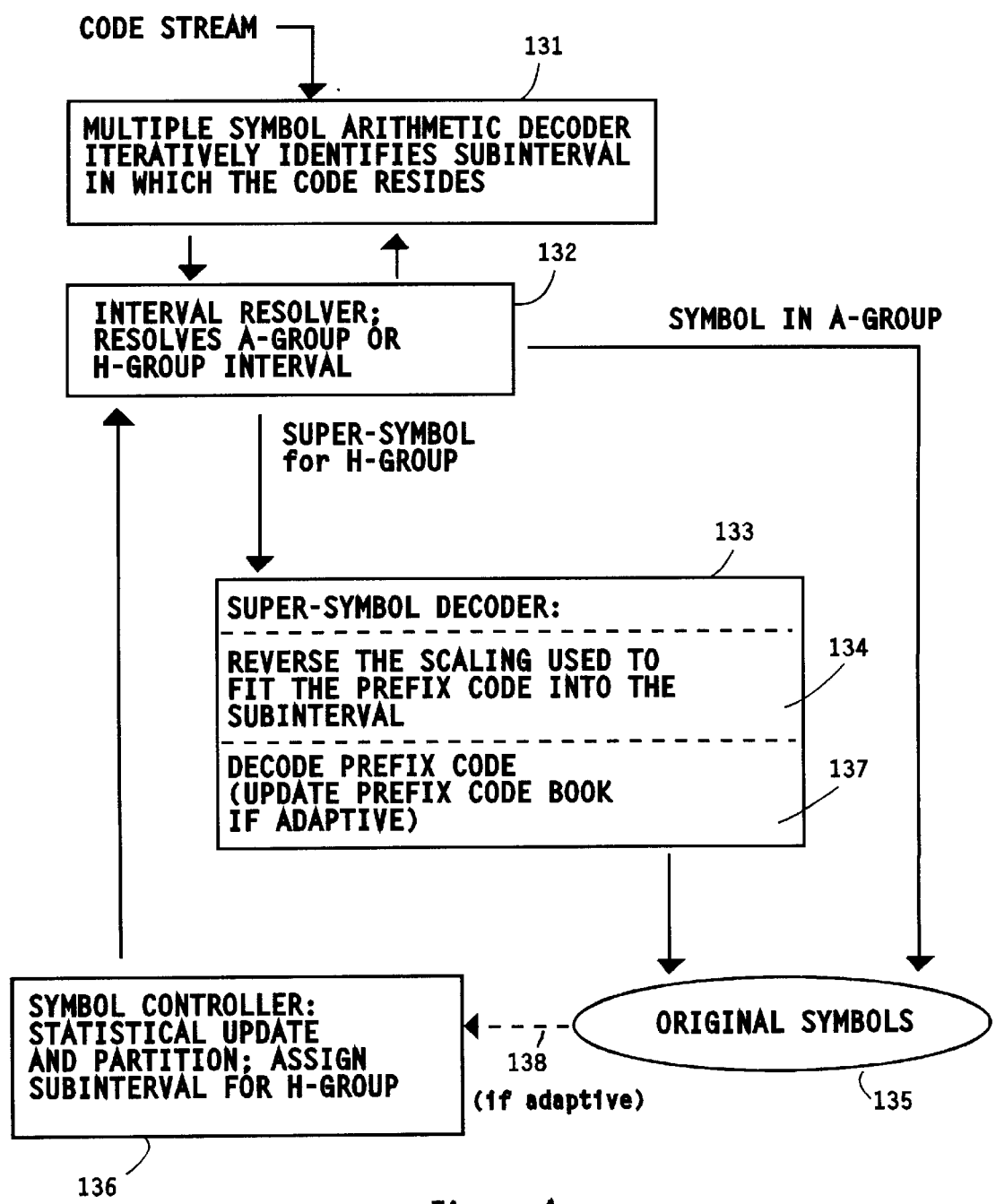
FIG. 4 illustrates the internal structure of an Approximated Multi-Symbol Coding System decoder corresponding to the encoder of FIG. 3.

The matching decoder for an embodiment, which is optionally adaptive, of the encoder in FIG. 3 is shown in FIG. 4. The code stream, which can contain encoded symbols and super-symbols, comes into a Multiple Symbol Arithmetic Decoder (MSAD) 131 which decodes the symbols and super-symbols by iteratively identifying the subinterval in which the code resides in the standard manner of Arithmetic decoding. The subinterval is resolved into either the A-Group or a super-symbol corresponding to one of the H-Groups by the Interval Resolver 132. As in the prior art of decoding the decoder must know certain information about the encoding process to allow it to track the current state of the encoder. In a two pass system the encoder may send a table of codes and intervals which contains everything that the decoder needs. In the adaptive one pass case the encoder and decoder each build their on tables incrementally as the unit is processed. One known method for communicating information from an encoder to a decoder in an adaptive system is to send a series of escape sequences from the encoder to the decoder which define the symbols as they are being encoded along with their relative frequencies (which are changing as symbols are being processed). If an A-Group Interval is being processed, then the MSAD has decoded the original symbol 135. As in the encoder symbol partitioning is performed. In the embodiment shown this function is the responsibility of the Symbol Controller 136 which tracks the encoder's subinterval assignments and the partition of the symbol values into the A-Group and H-Group(s). If an adaptive system is being implemented the original symbol is fed back to the Symbol Controller. In a two pass system the decoder will know the frequencies from the table information, etc. sent by the encoder. The SSUP's output goes back to the Interval Resolver 132. When the Interval Resolver 132 finds an H-Group subinterval the corresponding super-symbol must be further decoded to recover the original symbol 133. The super-symbol requires further processing by the Super-Symbol Decoder 133. If there is only one H-Group and it is partitioned as the subinterval closest to 0 (i.e. lowest or leftmost subinterval) the super-symbol only needs to have the scaling reversed 134 to convert it into a Prefix codeword which can then be decoded into the original symbol using standard Prefix decoding techniques 137, for example, by table look up in the code book. If there is more than one H-Group, then the super-symbol identifier is its position in the arithmetic interval. In addition a second H-Group is necessarily offset from the end of the interval because the encoder added the H-Group augend to the codestring at that point. This offset must first be subtracted to expose the original Prefix codeword which is then decoded to obtain the original symbol. This two step decoding procedure is the counterpart of the two step encoding procedure for H-Group symbols described earlier. If the decoder is adaptive the Prefix Code Book is also updated in the standard way 137.

Figure 5:
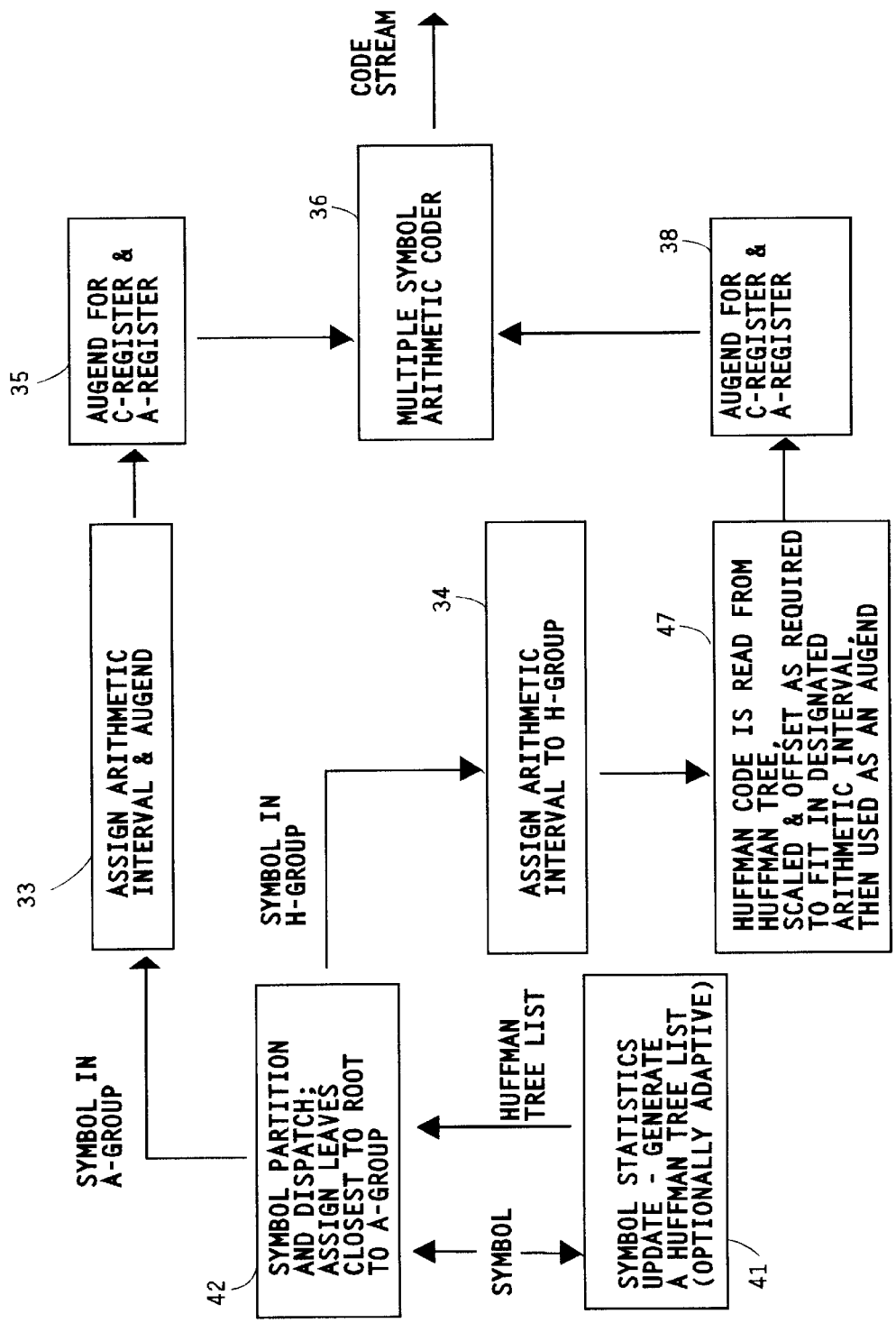
FIG. 5 illustrates the internal structure of a Approximated Multi-Symbol Coding System encoder implementing the invention using a Huffman Tree.

FIG. 5 shows a particular embodiment of the invention in an encoder which adaptively maintains and uses a Huffman Tree. This embodiment is also described in the C++ code listed in Appendix A. In this specific AMSAC Encoding system, rather than constructing the Prefix code anew in each adaptation, the prefix code continues to exist in the Huffman Tree and could be made self-adapting as well. The symbol counts or statistics are processed into a Huffman Tree List by a Huffman or Adaptive Huffman Encoding Unit 41. The Symbol Partition and Dispatch Unit 42 partitions the symbols into the A-Group or the H-Group where the A-Group symbols are located closest to the root and should be encoded with least bits. This will be discussed further below.

Symbols in the A-Group are coded directly into the Arithmetic code stream and symbols in the H-Group are coded using the Hybrid Arithmetic/Prefix technique, as follows: a) read the Huffman code from the Tree, and remove leading bits as the new subtree may be rooted from one internal node; b) apply scaling and offset if needed to fit the complete subtree into a designated interval (the result is called the augend); and c) encode the symbol by adding the augend to the codestring and then renormalizing. Steps a and b are performed by element 47. The other elements of the encoder described for FIG. 3 remain the same.

The matching decoder for the encoder embodiment in FIG. 5 is the same as shown in FIG. 4 except that SSUP 136 is replaced by an Adaptive Huffman Unit which uses an Adaptive (Dynamic) Huffman Tree. The Adaptive Huffman Tree is used as base for symbol partitioning with leaves closest to the root being assigned to the A-Group. A similar property can be applied to other prefix condition codes such as Shannon-Fano code, where leaves close to the root can be coded with Arithmetic subintervals, and the rest of the Tree fragments will be assigned H-Group Arithmetic intervals as has been described.

The Adaptive Huffman Unit can be replaced by the original symbol representation, i.e., 12-bit grey-scale image. For further detail on prior art Adaptive Huffman coding see M. Nelson's "The Data Compression Book," ISBN 1-55851-216-0, M&T Books, 1992.

The SSUO Unit 31 provides both the most probable symbol list and their relative probabilities. The statistics (symbol counts) may be accumulated on-the-fly in a one-pass approach either updating immediately after the symbol has been processed. Alternatively, "lazy update" may be used provided that the decoder uses the same algorithm. Lazy update refers to a method of delaying the update of the coding tables. The delay might be for a fixed number of symbols or some other convenient event which the decoder can also use. A twopass method may also be used wherein a first pass is made through the data to accumulate the statistics before generating the codes in a second pass.

The Symbol Statistical Unit 41 in FIG. 5 has the advantage that the Huffman tree retains the proper statistical ordering of the symbols frequencies. This is also true when the subtrees are being used. This simplifies the partitioning so that the A-Group consists of the leaves closest to the root. The remaining subtree(s) retain the characteristics of Huffman trees.

Figure 6:
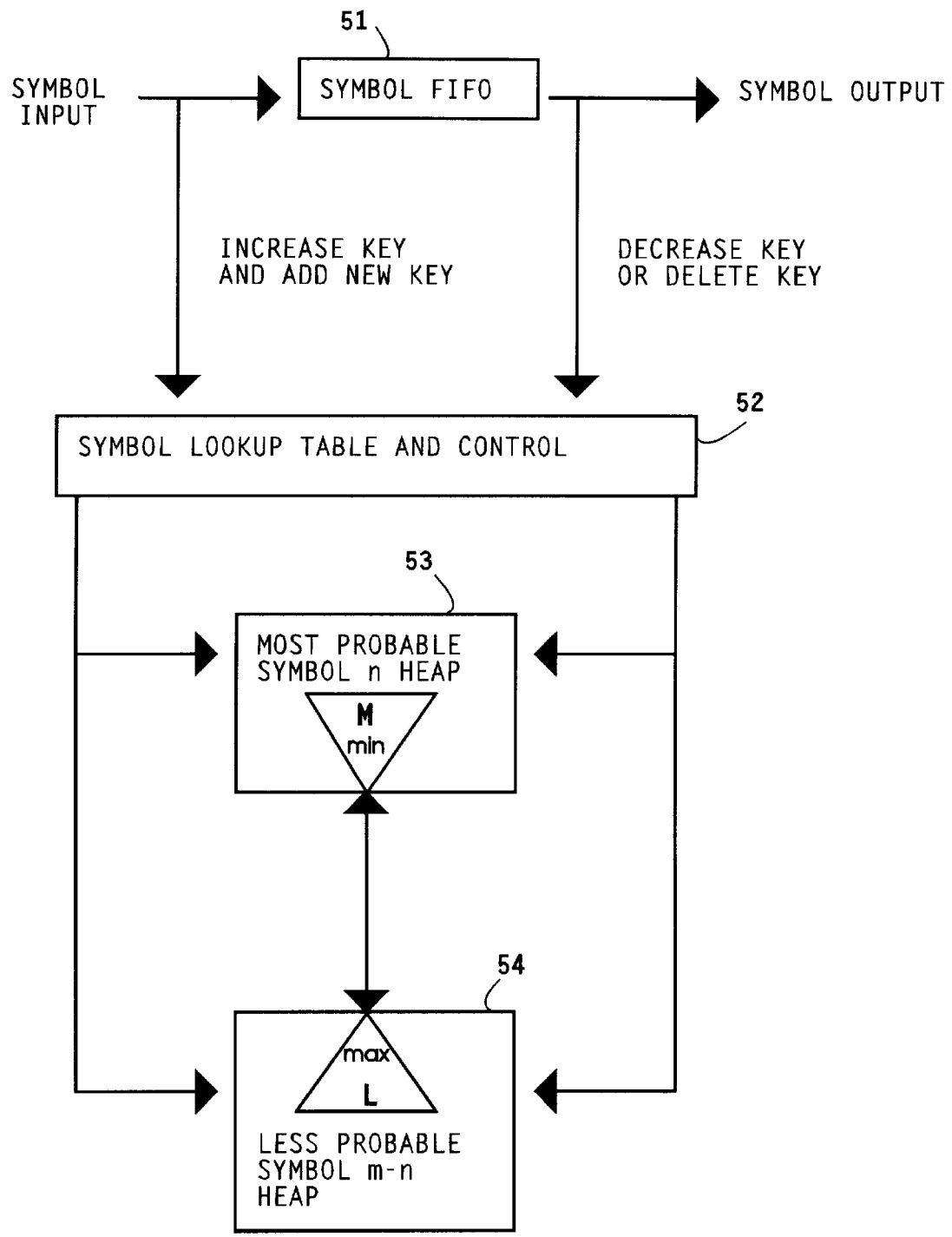
FIG. 6 illustrates the internal structure of a statistical unit which can be used in an implementation of the invention.

FIG. 6 shows three data structures 51, 53, 54 and their associated data paths for an embodiment of a Statistical Statistics unit. A FIFO 51 of fixed 4096 cells for symbols is used as a history buffer. When a symbol is enqueued, the same symbol is entered into one of two ordered lists 53, 54 if it is not yet in an ordered list. Either operation can be implemented very efficiently with a binary (partially ordered) heap. Associated with each symbol is its count which is used to partially order the heaps. (See "Introduction to Algorithms" by Thomas Cormen for general information on the use of heaps).

When a symbol enters the FIFO its associated count is incremented. Upon a symbol leaving a FIFO the associated count for the symbol is decremented. If the count is decreased to zero, then the symbol will be removed from the heap. Following changes in the counts the ordering of the heap will need to be adjusted. If the max of L heap is greater than the min of M heap, then the max(L) and the min(M) will be exchanged; and the respective heap orders will be updated accordingly.

The Symbol Lookup Table and Control 52 interfaces between the FIFO 51 and the two heaps 53, 54 described below. For n>1, the number of symbols to be coded in the Arithmetic form is greater than one. Two partially ordered heaps will be used: 1) Heap M 53, the more probable symbol heap, keeps the symbols in the order of probability with the less probable symbols first; and 2) Heap L 54, the less probable symbol heap, keeps the symbol in probability order with the more probable symbols first. Thus, in Heap M the more probable symbols are readily available. The relative frequencies of the symbols are used to assign the code space (sub-interval width) to the symbols in Heap M 53 and to the super-symbol representing the symbols in Heap L 54. To code m symbols using AMSAC, choose a small integer n-max, the maximum number of symbols to be coded in the Arithmetic form. The choice of n-max asserts bounds of the coding efficiency. For hardware implementation, n-max affects permanent cell count, complexity and speed. Once n-max is chosen, the actual n symbols coded in the Arithmetic form can be less than or equal to n-max, depending on source and coding efficiency needs. The remaining m–n symbols, which should be a great majority, will be coded in Huffman form and occupy one or more Arithmetic subintervals (h). Let h be the number of Huffman intervals. The total Arithmetic interval, hence, is reduced to n+h from m. Consider the alphabet of m=4096 symbols; the MSAC will need to partition the code space into 4096 sub-intervals. AMSAC, in the case of n-max=3 and h=1, needs a maximal of four sub-intervals. That presents a factor of 1000:1 computational reduction.

Arithmetic coding algorithms for encoding and decoding multiple symbols appear in many articles (see for example, J. Rissanen and K. M. Mohiuddin, "A Multiplication-Free Multialphabet Arithmetic Code," IEEE Transaction on Information Theory, Vol. IT.37, No. 2, pp. 93–98, February 1989). The detailed algorithm used will not be given here. Encoding and decoding a small number of symbols with AMSAC reduces the computational complexity.

Below is a simple way of splicing in the Huffman codes into the Arithmetic interval. Assign a Q(H) value of a negative powers of 2 ($\frac{1}{2}, \frac{1}{4}, \ldots$) to the width of the H-group subinterval denoted as Q(H). In the case of splitting the H-group into multiple subintervals H1, H2, etc., assign each such subinterval an interval width value Q(H1), Q(H2), etc., such that each is a negative power of 2. If the probability sum of the Arithmetic symbols is less than $\frac{1}{2}$, then switch completely to Huffman coding.

By using conditional probability distributions, i.e., by properly choosing contexts, the compression can be improved. Sometimes drastic improvements can be made, such as in the area of image coding. For example, if "0" always follows "1", then a two-bit (order of two in the bit symbol case) context can be used to improve compression. For eight-bit symbols, a zero-order model needs a code table of size 256. The coding unit needs to send both the compressed code and the code book of size 256 to the receiving unit which has the decoder. In the first-order model, the code book size is 256*256. For the second-order model, the code book grows to 256*256*256. The growth of the table size quickly erodes the compression gain. One solution to this problem is for the decoder/encoder to both generate tables at the same pace which allows the coder to send only the code and not the code book. Adaptation is a process of generating a set of effective code books.

Gallager's 1978 paper first noted that the Huffman Tree is completely identical to a sibling list. (R. C. Gallager, "Variations on a Theme by Huffman", Vol. IT.24, No. 6, pp. 668–674, November 1978). A Huffman Tree can be converted to the sibling list; and if the sibling list exists, the Huffman tree exists. A sibling list has the following properties:

All internal nodes, the root, and the leaves are include in a linear list.

If the root is placed at left on the linear list, then all nodes can be listed in non-increasing order and the sibling in the Huffman tree is also a sibling on the sibling list. The Sibling list is very effective for dynamic (one-pass) Huffman encoding implementation. The partitioning of the symbols is simplified by applying a cutting algorithm directly on the sibling list. With the sibling list, a fast scan-line cutting algorithm can select the A-Group symbols as those leaves closest to the root. Although only a single-subtree cutting algorithm has been discussed, a multiple-subtree cutting algorithm is similar and can easily be derived from the information given.

Appendix A contains the listing of C++ programming code, illustrating a particular implementation of the AMSAC technique. Appendix B shows a sample of the output of the C++ program using the code shown in Appendix A. Some possible simplifications of the code could be based on the following key functional units or algorithms: AHUFF, a complete adaptive Huffman coding system; Multiple Alphabet Arithmetic Coding Unit; Fast Single-subtree Detection algorithm; Renorm algorithm; Carryover Handling algorithm; Coding Numerical Resolution Unit; and an Integrated Arithmetic and Huffman Encoding/Decoding Unit. The objective of the Single-subtree Detection algorithm is to determine a cut-line given a Huffman tree. The cut-line partitions the Huffman symbols into two groups with the following desired properties. The A-Group symbols will be coded in Multi-Alphabet Arithmetic coding. The H-Group symbols will be coded using the hybrid Arithmetic/Huffman coding described above. The A-Group symbols have the higher probabilities. The maximum number of symbols which can appear in the A-Group is denoted by n-max. All of the Huffman symbols can be rooted from a single internal node. All Huffman symbols occupy one subinterval of the Arithmetic interval. Therefore, the total number of Multi-Alphabet Arithmetic symbols are n-max +1" (maximum number of symbols). The total probability mass for the A-Group symbols should preferably exceed 50%. The symbol order will be adjusted so that the Huffman symbol Q(H) representing the complete set of Huffman symbols will be placed next the low end of interval as shown in FIG. 2. The objective is to find the cut-line which divides the symbols in the A-Group from the H-Group. All H-Group symbols are rooted from a single internal node in the A-Group. This internal node represents the super-symbol. All H-Group symbols form a single subtree rooted from the super-symbol node in the A-Group. The output in Appendix B illustrates the adaptive cutting process. For example, on page B11 in the section beginning with weight=31, the cut-line is marked by the message "Starts Huffman Group" which in this example occurs between nodes 8 and 9. The super-symbol is therefore node 5 which is the parent of node 9 and 10 which makes it the parent of the subtree containing all of the remaining nodes in the H-Group.

The condition that the Huffman symbols should be last in the list used to allocate the subintervals is met. The subintervals are allocated from A (codespace or A-Reg) to 0.0 using the list, therefore the Huffman symbols will be allocated the subinterval including 0.0 since they are last in the list. Two algorithmic approaches have been considered. A Brute-force State Machine which tracks all forward and backward links of every node from the root down requires detailed knowledge of the Huffman tree structure. A simpler approach is to determine the cut-line based on the sum of the "out-degree" which is simply the number of connecting edges in the Huffman tree which are being cut to form the subtrees. The algorithm used in Appendix A is limited to cutting out one subtree which by definition is connected by two edges (i.e., out-degree=2) into the super-symbol node. A similar approach can easily be implemented to cut multiple subtrees which would have higher out-degrees. The approach is to simply scan the sibling list which is used for the adaptive Huffman tree which runs faster than the brute force approach and is theoretically more rigorous. The Single-subtree Detection algorithm includes the following steps:

1. Scan the sibling list (Huffman tree) from left (more probable) to right (toward least probable). For n-max=4 the maximum number of nodes to be scanned is nine. The cut-line is initialized to zero.
2. Count the out-degree as follows: root, up two; internal node, up one; leaf, down one.
3. Any leaf encountered represents a symbol to be included in the A-Group of symbols. The order in which the symbols for the A-Group are encountered will automatically correct order for assigning the subintervals.
4. If the out-degree equals "2", "1" or "0", then record the scan position as the cut-line. If the out-degree equals "0", then every symbol is in the A-Group, and then exit because there is nothing else to do.
5. If all allowable nodes have been scanned, the cut-line is greater than "0", then the node [cut-line+1] has the back pointer pointing back to the single common Huffman internal node for all H-Group symbols.
6. Put the Huffman internal node at the end of the Arithmetic symbol list.

The criteria for making the cut can be based on various factors including: a) a fixed number of symbols which is selected in advance, e.g., a system might always select one symbol for the A-Group; b) symbols which have a combined frequency greater than a predetermined threshold; and c) a number of symbols with an average frequency exceeding a threshold; d) minimum closeness to the root.

A proof of this algorithm can be outlined as follows.
Step 1

Every Huffman node has two out-degrees, except a leaf which is one in-degree. The root has two out-degrees. For an internal node, add one out-degree, since it consumes one input degree and adds two out-degrees. For a leaf, external node, subtract one out-degree, since it consumes one input degree.

Step 2

A legitimate cut-line will have three possible distributions. Two of these distributions are represented by all leaves (symbols) being in either the A-Group or the H-Group. In this case, the other group will be empty. In the third case, there are leaves (symbols) in both the A-Group and the H-Group. All of the Huffman symbols are rooted from a single internal node. This internal node will be treated as an Arithmetic symbol. In this case, there should be exactly two out-degrees from the A-Group to the H-Group.

Step 3

For the case where there are symbols in both the A-Group and the H-Group, the algorithm claims the node to the right of the cut-line has the back pointer pointing to the common inter-node, the head of a single subtree. Because of the sibling property, the left and right siblings will be pointing to the same parent. Therefore, the two out-degrees will be consumed by a pair of siblings. Assuming the out-degree of 2 are not pointing to the two nodes immediately to the right of the cut-line, then there is a contradiction. There has to be at least four out-degrees from the A-Group since the immediate two nodes will consume two out-degrees.

Example 1 of AMSAC will now be described. In this example, there are four symbols {a,b,c,d} to be coded. One super-symbol representing the H-group will be coded in the Arithmetic form Q(H)=0.1 b. The super-symbol is the first subinterval which means that its augend is zero. Thus, no offset (augend) needs to be added to the C-register in this case. Note that the suffix "b" is used to designate a binary number, so 0.1 b=0.5 decimal. Q(H), called augend, is used to simplify the computation so that the multiplication and division operations are reduced to simple add and subtract operations. The augend is 0.1 b, which is obtained as follows. A-Reg, the code space, is approximated as 1.3 decimal. The LPS probability sum (of symbols b, c, d) is=0.4 decimal. Q(H), the augend, is approximated as: Q(H) ^=LPS probability times the approximated A-Reg=1.3*0.4=0.52 decimal, or approximately=0.5 decimal or 0.1 b. All symbols b, c, and d are grouped to a single Arithmetic symbol which is the Huffman subinterval of fixed size Q(H). The Huffman subinterval(s) should have fixed size(s) that is (are) a negative power of 2, otherwise the simplicity of Huffman decoding reverts to the more complex Arithmetic coding operation. In Arithmetic coding, the size of the interval is maintained by the value in the A-Reg, and the arithmetically coded symbols are scaled to this interval according to their respective probabilities. The H-group is assigned a fixed value Q(H), eliminating the need to rescale the portion of the interval assigned to the H-group. This example uses the Arithmetic/Huffman Hybrid code, but it is important to note, that Arithmetic/Prefix code will also work. For example, Arithmetic/Shannon-Fano code is a good Hybrid as well.

The symbol probabilities for the example are:

Prob(a)=0.75, Prob(b)=0.125, Prob(c)=0.0625, Prob(d)=0.0625. One symbol will be coded in the arithmetic form: Q(H)=0.01 b. Q(H), which is called the augend, is used to simplify computation so that the multiplication and division operations are reduced to simple add and subtract. This method is used extensively in IBM's BAC (see "Introduction to Arithmetic Coding" cited earlier) and Q-Coder which have been described in the literature. Symbols b, c, and d are grouped into a single arithmetic subinterval called the Huffman subinterval. The Huffman subinterval is sized as powers of 2 of negative integer. Within the Huffman subinterval, the Huffman encoding of symbols b, c, and d yields: b=1, c=01,d=00 which is the code book. These Huffman codes are fit into the Huffman subinterval [0.0000 0.0100). The "[" symbol indicates that the first end point of the interval is included, whereas the ')' means the last point is not included. The encoded Huffman symbols are pre-scaled to be used as augends for the arithmetic encoding yielding: b=0.001, c=0.0001, d=0.0000.

The message to be encoded is

"a a a a a a b a a a a a a a a c d".

The code will then be decoded to retrieve the exact original source for verification the correctness of encoding.

Table 1 shows the sequence of the C-Reg and the A-Reg for "a a a a a a b". The numbers used in the following Tables are in binary unless otherwise noted. The horizontal lines mark a subtraction or addition operation. In the example, the encoding of the first "b" results in three shifts as follows: the code space for the super-symbol is 0.01 (i.e. $2^{-2}$) and for "b" it is 0.1 (i.e. $2^{-1}$) which is a factor of $2^{-3}$. To renormalize 0.0010 to 1.0000 requires 3 left shifts.

TABLE 1

SESSION 1: encoding source "a a a a a a b".

| Input | Encoding | | | Output | Decoding | | |
|---|---|---|---|---|---|---|---|
| | C-Reg | | A-Reg | | C-Reg | | A-Reg |
| | .0 | | 1.0 | | .11001 | | 1.0 |
| a + | 0.01 | − | 0.01 | a − | 0.01 | − | 0.01 |
| | .01 | | 0.11 | | .10001 | | 0.11 |
| | 0.1 | < | 1.1 | Renorm A&C left shift one bit | 1.0001 | < | 1.1 |
| a + | 0.01 | − | 0.01 | a − | 0.01 | − | 0.01 |
| | 0.11 | | 1.01 | | 0.1101 | | 1.01 |
| a + | 0.01 | − | 0.01 | a − | 0.01 | − | 0.01 |
| | 1.00 | | 1.00 | | 0.1001 | | 1.00 |
| a + | 0.01 | − | 0.01 | a − | 0.01 | − | 0.01 |
| | 1.01 | | 0.11 | | 0.0101 | | 0.11 |
| | 10.10 | < | 1.10 | Renorm A&C left shift one bit | 0.101 | < | 1.1 |
| a + | 0.01 | − | 0.01 | a − | 0.01 | − | 0.01 |
| | 10.11 | | 1.01 | | 0.011 | | 1.01 |
| a + | 0.01 | − | 0.01 | a − | 0.01 | − | 0.01 |
| | 11.00 | < | 1.00 | | 0.001 | | 1.00 |
| b + | 0.001 | | | b | table look up | | |
| | 11.001 | | | | | | |

TABLE 1-continued

| | | |
|---|---|---|
| 11001 | < < < three left shifts, since b=0.001 has three bits of precision Total of 5-bit code 11001 generated | |

SESSION 2: encoding source "a a a a a a a a c".

| Input | Encoding | | | Output | Decoding | |
|---|---|---|---|---|---|---|
| | C-Reg | | A-Reg | | C-Reg | A-Reg |
| | .0 | | 1.0 | | .1101101 | 1.0 |
| a + | 0.01 | – | 0.01 | a – | 0.01 | – 0.01 |
| | 0.01 | | 0.11 | | .1001101 | 0.11 |
| | 0.1 | < | 1.1 | Renorm A&C left shift one bit | 1.001101 | < 1.1 |
| a + | 0.01 | – | 0.01 | a – | 0.01 | – 0.01 |
| | 0.11 | | 1.01 | | 0.111101 | 1.01 |
| a + | 0.01 | – | 0.01 | a – | 0.01 | – 0.01 |
| | 1.00 | | 1.00 | | 0.101101 | 1.00 |
| a + | 0.01 | – | 0.01 | a – | 0.01 | – 0.01 |
| | 1.01 | | 0.11 | | 0.011101 | 0.11 |
| | 10.10 | < | 1.10 | Renorm A&C left shift one bit | 0.11101 | < 1.1 |
| a + | 0.01 | – | 0.01 | a – | 0.01 | – 0.01 |
| | 10.11 | | 1.01 | | 0.10101 | 1.01 |
| a + | 0.01 | – | 0.01 | a – | 0.01 | – 0.01 |
| | 11.00 | | 1.00 | | 0.01101 | 1.00 |
| a + | 0.01 | – | 0.01 | a – | 0.01 | – 0.01 |
| | 11.01 | | 0.11 | | 0.00101 | 0.11 |
| | 110.10 | < | 1.10 | Renorm A&C left shift one bit | 0.0101 | < 1.1 |
| a + | 0.01 | – | 0.01 | a – | 0.01 | – 0.01 |
| | 110.11 | | 1.01 | | 0.0001 | 1.00 |
| c + | 0.0001 | | look up | c | 0.0001 | look up |
| | 110.1101 | | | | | |
| 1101101 | < < < < four left shifts, since c=0.0001 has four bits of precision Total of 7-bit code 1101001 generated | | | | | |

SESSION 3: encoding source "d".

| Input | Encoding | | Output | Decoding | |
|---|---|---|---|---|---|
| | C-Reg | A-Reg | | C-Reg | A-Reg |
| | 0.0000 | 1.0 | | .0000x | 1.0 |
| d + | 0.0000 | 1.0 | d | decode d look up | |
| | 0000. | 1.0 | < < < < left shift four times Total of 4-bit code 0000 generated | x | 1.0 |

**Renormalization:
Use one or multiple left shifts on both on Areg and Creg, the
purpose of renorm is to ensure that Areg (also called code space)
is between 1 and 2.

o Coding Efficiency Analyses:
  1. Huffman Encoding:
     a(14) = 14 × 1 = 14
     b(1)  = 1 × 2 =  2
     c(1)  = 1 × 3 =  3
     d(1)  = 1 × 3 =  3

22 bits total
  2. AMSAC Encoding:
     "aaaaaab"    5
     "aaaaaaaac"  7
     "d"          4

16 bits total
  3. Entropy (MSAC can reach within few percent of entropy):
     a(14) = 14 × 0.415 = 5.81
     b(1)  = 1 × 2 =      2
     c(1)  = 1 × 3 =      3
     d(1)  = 1 × 3 =      3

13.81 bits total

Two encoding paradigms:

1. Pre-partition the symbols set such that {a} occupies an Arithmetic subinterval while {b,c,d} as a super-symbol share a single Arithmetic subinterval of ¼. Since {b,c,d} share a single Arithmetic subinterval, the prefix-like property of b,c,d allows fast decoding by table look-up to resolve the original symbol. In this case the cut-line partitions {a} into the A-Group and {b,c,d} as the H-Group.

Figure 8:
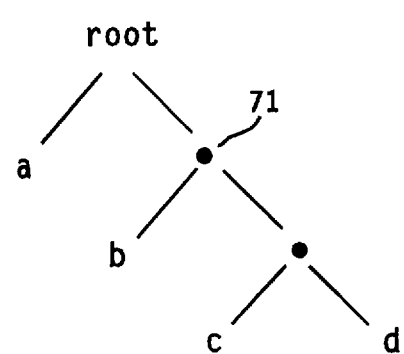
FIG. 8 is an example of a Huffman tree.

2. Place all symbol in a Huffman tree and post-partition the symbol set. FIG. 8 shows the tree for the symbol set {a,b,c,d}. Splice symbol 'a' out, since 'a' is closest to the root, and let 'a' occupy an Arithmetic interval by itself. The pruned Huffman subtree now has {b,c,d} symbols, and has new root 71. Although in this example, the pruned Huffman tree has the same partitioned result as in paradigm 1, there could be multiple disconnected Huffman subtrees left. And they can each occupy one Arithmetic sub-interval or be grouped together to occupy fewer Arithmetic sub-intervals. It is also possible, that a single sub-Huffman tree can be partitioned to occupy several Arithmetic intervals. The second partition paradigm is effective for implementing one-pass dynamic AMSAC.

Example 2 of AMSAC which is a modification of Example 1 will now be described. Example 2 shows that one Arithmetically encoded stream and a separate Huffman encoded stream can be constructed. The same problem setup given in Example 1 will be used. Even though a different method is used, it will generate the same number of bits of coded output as in Example 1. The two codes stream can be blended to get one coded stream which is identical to the Example 1. One symbol will be coded in the pure Arithmetic form $-Q(H)=0.01$ b. Symbols b, c, and d are grouped to a single Arithmetic Huffman subinterval. If the Huffman sub-interval is encountered, a second coded stream will be created using: b=1 b, c=01 b, d=00 b. When a symbol in {b,c,d} is encountered, the augend is 0.00 and both A-reg and C-reg are going to shift two bits left.

As before, the source will be encoded (and decoded):

"a a a a a a b a a a a a a a a c d".

TABLE 2

SESSION 1: encoding source "a a a a a a b".

| Input | Encoding | | | Output | Decoding | | |
|---|---|---|---|---|---|---|---|
| | C-Reg | | A-Reg | | C-Reg | | A-Reg |
| | .0 | | 1.0 | | .1100 | | 1.0 |
| a + | .01 | − | 0.01 | a − | 0.01 | − | 0.01 |
| | .01 | | 0.11 | | .1000 | | 0.11 |
| | 0.1 | < | 1.1 | Renorm A&C left shift one bit | 1.000 | < | 1.1 |
| a + | 0.01 | − | 0.01 | a − | 0.01 | − | 0.01 |
| | 0.11 | | 1.01 | | 0.110 | | 1.01 |
| a + | 0.01 | − | 0.01 | a − | 0.01 | − | 0.01 |
| | 1.00 | | 1.00 | | 0.100 | | 1.00 |
| a + | 0.01 | − | 0.01 | a − | 0.01 | − | 0.01 |
| | 1.01 | | 0.11 | | 0.010 | | 0.11 |
| | 10.10 | < | 1.10 | Renorm A&C left shift one bit | 0.101 | < | 1.1 |
| a + | 0.01 | − | 0.01 | a − | 0.01 | − | 0.01 |
| | 10.11 | | 1.01 | | 0.01 | | 1.01 |
| a + | 0.01 | − | 0.01 | a − | 0.01 | − | 0.01 |
| | 11.00 | < | 1.00 | | 0.00 | | 1.00 |
| Q(H)+ | 0.00 | | | 1. in {b,c,d} group | | | |
| | 11.00 | | | 2. Huffman decode as 'b' | | | |
| 1100 | < < two final left shifts, since {a,b,c} (which is a super-symbol) 0.00 has two-bit precision | | | | | | |
| | *now Arithmetic stream has encoded 4 bits "1100" | | | | | | |
| | *a separate Huffman stream has 1 bit A separate Huffman Stream is "1" | | | | | | |
| 1 | *Total of 5-bit code generated | | | | | | |

SESSION 2: encoding source "a a a a a a a a c".

| Input C | Encoding | | | Output | Decoding | | |
|---|---|---|---|---|---|---|---|
| | C-Reg | | A-Reg | | C-Reg | | A-Reg |
| | .0 | | 1.0 | | .11011 | | 1.0 |
| a + | .01 | − | 0.01 | a − | 0.01 | − | 0.01 |
| | .01 | | 0.11 | | .10011 | | 0.11 |
| | 0.1 | < | 1.1 | Renorm A&C left shift one bit | 1.0011 | < | 1.1 |
| a + | 0.01 | − | 0.01 | a − | 0.01 | − | 0.01 |
| | 0.11 | | 1.01 | | 0.1111 | | 1.01 |
| a + | 0.01 | − | 0.01 | a − | 0.01 | − | 0.01 |
| | 1.00 | | 1.00 | | 0.1011 | | 1.00 |
| a + | 0.01 | − | 0.01 | a − | 0.01 | − | 0.01 |
| | 1.01 | | 0.11 | | 0.0111 | | 0.11 |
| | 10.10 | < | 1.10 | Renorm A&C left shift one bit | 0.111 | < | 1.1 |
| a + | 0.01 | − | 0.01 | a − | 0.01 | − | 0.01 |
| | 10.11 | | 1.01 | | 0.101 | | 1.01 |
| a + | 0.01 | − | 0.01 | a − | 0.01 | − | 0.01 |
| | 11.00 | | 1.00 | | 0.011 | | 1.00 |
| a + | 0.01 | − | 0.01 | a − | 0.01 | − | 0.01 |
| | 11.01 | | 0.11 | | 0.001 | | 0.11 |
| | 110.10 | < | 1.10 | Renorm A&C left shift one bit | 0.010 | < | 1.1 |
| a + | 0.01 | − | 0.01 | a − | 0.01 | − | 0.01 |
| | 110.11 | | 1.01 | | 0.00 | | 1.00 |
| c + | 0.00 | | look up | | 0.00 | | |

TABLE 2-continued

|  |  | 1. in {b,c,d} |
|---|---|---|
| 110.11 |  | 2. Huffman decode as 'c' |
| 11011 | < <  two left shifts, |  |
|  | since c=0.00 has two bit precision |  |
|  | *Arithmetic coded stream "11011" |  |
| 01 | *Huffman coded stream "01" |  |
|  | Total of 7-bits code generated |  |

SESSION 3: encoding source "d".

| Input | Encoding | | Output | Decoding | |
|---|---|---|---|---|---|
|  | C-Reg | A-Reg | C-Reg |  | A-Reg |
|  | 0.0000 | 1.0 | .00x |  | 1.0 |
| d + | 0.00 | 1.0 |  |  |  |
|  | 1. In Arithmetic interval {b,c,d} | | | | |
|  | 00. | 1.0 | < < | | |
|  |  | left shift two times | | | |
|  | *Arithmetic coded stream "00" | | | | |
|  | Huffman encode 'd' | | | | |
| 2. | Huffman look up on the second stream, | | | | |
|  | *Huffman coded stream "00" | | | | |
|  | *Total of 4-bit code generated | | | | | oSummary
 1. The non-instream Arithmetic and Huffman encoding scheme
generated two coded streams as:
    Arithmetic   1100    11011    00
    Huffman        1        01    00
 2. Note the number of bits is identical to AMSAC Example 1
shown above.
13. In fact, Arithmetic and Huffman streams can be mixed in an
interleave fashion as:
    1100 1 11011 01 00 00
 4. Note the above stream is identical to AMSAC result in
Example 1:
    11001    1101101    0000

The interleaving shown could be achieved by combining the two code streams by concatenating the respective portions as they are generated.

Having described the invention by way of embodiments it will be clear to anyone skilled in the art that changes in form and detail may be made in these embodiments without departing from the teachings of the invention. Software embodiments of the invention, or components of the invention, as either encoders or decoders may be stored as computer programming code in or on any computer readable media such as, but not limited to, ROMs, diskettes, hard disks, magnetic tape or optical disks.

APPENDIX A

```cpp
/****************** Start of MAIN-C.CPP ***********************/
#include <stdio.h>
#include <stdlib.h>   // atoi: convert string to integer
#include <assert.h>   // used for assert
#include "camsac_h.h"
int main(int argc,char* argv[])
    {
    unsigned short usSymbolSize ;
    unsigned short usPureArithmSymbolSize;
    CAHuffmanTree* pCAhuff ;
    if ( argc < 5 )
        {
        printf( "\nUsage: %s source.fn code.fn symbolsize arithsize \n", argv[0] );
        exit( 0 );
        }
    usSymbolSize = (unsigned short) atoi (argv[3]) ;
    assert (usSymbolSize == 256 ) ; // current symbol size default is 256
    usPureArithmSymbolSize = (unsigned short) atoi (argv[4]);
    pCAhuff= new CAMSAC ( usSymbolSize, usPureArithmSymbolSize ) ; //
                // 4 was used as the arithmetic symbols limit
                // it should be passed in as a parameters to the program instead
                // to reset the initial statistics and file input.putput
                // print compression ratio
                // open files and close files
    pCAhuff->CompressFile (argv[1], argv[2], argv[0]) ; // arg[0].rpt new
    delete pCAhuff ;         // signal ends
    return( 0 );
}
/****************** End of MAIN-C.CPP***********************/
```

SA9-94-067

/****************** Start of CAMSA_H.H *******************/

```
/*

AMSAC: Approximated Multiple Symbol Arithmetic Coder

* An Adaptive AMSAC Implementation

* CIO is switched to new version

*/ ifndef _AMSACLS_H
define _AMSACLS_H include "cbitio_h.h"
include "cahuff_h.h"

typedef struct ArithmType
{
        short   sAgroup ;               // pointer to the last node of A-Group // This version supports one node in A-Group which is the
                        // root to all H-Group symbols.
                        // sAGroup = 0, means no symbol in A-Group.

short   sArithmSymbolSize ;     //the pure arithmetic symbol size + 1 short   sNodeLimit ;            // max number of nodes in arithmetic group short*  psSymbol ;              // this is pointer to array of pure arithmetic symbol
                                        // plus the Huffman arithmetic symbol
                                        // the symbol is properly listed in frequency order short   sSymbolTotal ;          //record how many pure symbols are to be coded in
                                        // the arithmetic mode, usually this number plus 1
                                        // is the total arithmetic intervals.
                                        // In  case fFullArithm is 1, no Huffman group
                                // is required.

short   ssingleSubTreeNode ;

unsigned short    usAReg ;      // to be initialized to 1.000000
        unsigned short    usCReg ;      // to be initialized to 0.000000 unsigned short    usMPHSMask ;          // most probable Huffman Symbol Mask
```

```
                                        // usMPHS limits the augend resolution
                                        // FLAG fArithmOnlyMode ;
                                        // all symbols are in A-Group
}       ARITHMTYPE ;

class CAMSAC : public CAHuffmanTree
{
public:

CAMSAC
                (
                        unsigned short usSymbolSize,// max size for the Huffman symbols
                        short sArithmSymbolsize         // max size for the arithmetic
                                        // symbols
                );

virtual void CompressFile
                (
                        char* cSourcFile,
                        char* cCodedFile,
                        char* cReport
                );

virtual void InitializeNodes    ( void );       // initialize sibling nodes virtual void CAMSAC::EncodeSymbol
                (
                        const unsigned short usSymbol
                );

short SingleSubTreeDetect
                (
                        ArithmType& Arithm // call-by-reference not by-value
                );

// virtual void DecompressFile (char* cCodedFile, char* OriginalFile, char* cReport);

short PrintHuffmanNodes
                (
                        const short sEndNode // call-by-copy
                );
```

```
protected:

FLAG        fArithmSession ;

ARITHMTYPE  Arithm ;          // Note!! this is the struct ArithmType short       sOutDegree ;
    short       sCutPointOutDegree ;

};
#endif /* _AHUFF_H */
/******************* End of AHUFFCLH.H *************************/
```

/***************************/Start of CAMSAC.CPP***************************/

This is a simple version of AMSAC:

- AMSAC is fully adaptive:
   - All symbols are partitioned into two groups:
        * The symbols in the arithemetic group is coded in pure arithmetic form
        * The Huffman symbols will be coded with Adaptive Huffman coder and
            scaled into the arithmetic interval
   - All Huffman symbols will be rooted from a sigle internal Huffman node
        or root. The fast single-sub-tree detection algorithm will detect
        such condition and place the Huffman Sub-tree in the last arithmetic
        interval. Note the first arithmetic interval is the arithmetic symbol
        occurs the most.

10-10-95 Tuesday,

Bypassed buggy ofstream outFile ("copy.out", ios:out) on
        Borland Compiler 2.0

- found ofstream * pointer corrupted has nothing to do with the
            data type; instead, it is corrupted when a fixed output size is
            reached, ie. char size reaches 1991
        - increased the config.sys sizes of BUFFER and FILE to 50
        - change compile size from SMALL to COMPACT
        - The arithmetic symbols are kept in
            **      Arithm.psSymbol[Arithm.sSymbolTotal]
            ** in sorted order except the HGroup, which is place at last
        - the PrintHuffmanNodes () now added the Arithmetic symbol print 10-11-95 Wednesday Tasks:
        - To sort out a unify method for signaling the Arithm mode
        - To enter a complete encoder/adaptation flow chart
        - To enter a complete decoder/adaptation flow chart
        - To establish algorithm for assigning the arithmetic interval
            size.

*/ include <stdio.h>
include <stdlib.h>
include <string.h>
include <ctype.h>

```
#include <iostream.h>
include <assert.h>
#include <time.h>                    // time_t ltime, time(<imes)

// #include "bitioclh.h"
#include "cio_h.h"

#include "camsac_h.h"

time_t ltime ;                       // 10-10-95, get time stamp

// Sunday, 5-28-95
// Constructor to invoke base constructor

CAMSAC :: CAMSAC
        (
                unsigned short usSymbolSize,    // max size for the CAHuff symbols
                short sArithmSymbolSize         // max size for the arithmetic
symbols
        )
        : CAHuffmanTree ( usSymbolSize )        // pass to the constructor of the base // compiled and ran correctly, Monday, 5-29-95
        {

Arithm.sArithmSymbolSize = sArithmSymbolSize + 1 ;
        Arithm.sNodeLimit = sArithmSymbolSize * 2 + 1 ;

Arithm.psSymbol = new short[Arithm.sArithmSymbolSize] ;  // new made
        Arithm.sSingleSubTreeNode = 0 ;

// Arithm.fArithmMode = 0 ;   to turn off arithmetic mode initally
                                                                  // may not be
needed; can tell by single cone node
        }

// Sunday, 5-28-95
// This is an implicitly virtual function.
// It can be overriden depends on the object pointer used.

void CAMSAC :: CompressFile
        (
                char* cOriginalFile,
                char* cCodedFile,
```

```
        char* cReport
)
{ unsigned short usSymbol ;
float fCompressionRatio ;
char Msg[80] ;
char cTempReport [80] ;
char *cPtr ;

strcpy (cTempReport, cReport) ;

if ((cPtr = strchr (cTempReport,'.')) != NULL) cPtr[0] = '\0' ;
                                                                        // terminate the string strcat (cTempReport,".rpt") ;      // needs room to concatinate postfix // if ((fReport = fopen (cTempReport, "a")) == NULL)
//      {
//      cout << "\n Can not append open report file: " << cTempReport ;
//      cout << "program will crash!" ;
//      exit (98) ;
//      }
        pCIO = new CIO (cTempReport) ;        // instantiation made to text input-outpout
        assert (pCIO != NULL ) ;               // use better defensive checker later if ((fInput = fopen (cOriginalFile, "rb")) == NULL)
                pCIO->Crash ("Error READ open binray input file", 77) ;

if ((pCBitOutput = new CBitOutput (cCodedFile)) == NULL)
                pCIO->Crash ("Error Write Open output bit file",76 ) ;

sprintf (Msg,
                "\n** Source: %s; Coded: %s;\n   Symbol_MAX: %4i; Arithm_MAX: %4i\n",
                cOriginalFile, cCodedFile, usEndOfStream,
Arithm.sArithmSymbolSize ) ;

pCIO->Msg("Starts Experimental AMSAC Compression Session",Msg) ;

time (<ime) ;
        sprintf (Msg,"The time is %s",ctime (<ime)) ;
        pCIO->Msg(Msg,"\n");
```

SA9-94-067          A7

```
            InitializeNodes();
            while ( ( usSymbol = getc( fInput ) ) != EOF )
                    {
                    EncodeSymbol( usSymbol);   // to make more changes: C-Reg is to
generate
                    UpdateModel( usSymbol );   // output codes // new experimental codes added as follows
                    // 10-10-95 Tuesday, needs more modifications SingleSubTreeDetect (Arithm) ;
                    // if (fArithmSession) PrintHuffmanNodes (Arithm.sAGroup) ;

}
            EncodeSymbol( usEndOfStream );

delete pCBitOutput;   // this is necessary to properly end the compression
                                                                            // as output
buffer rack may still have code residu.
                                                                            // the output
bit file will be closed
            fclose (fInput) ;   // close input original file // this section is entered assuming that both input and output
                    // files for compression are closed !!

if (lFileSize (cOriginalFile) > 0)
                    fCompressionRatio =
                            ((float) lFileSize(cCodedFile)) / ((float) lFileSize(cOriginalFile)) ;

sprintf (Msg,"Compression Ratio is %8.3f bits/char",8*fCompressionRatio) ;

pCIO->Msg (Msg,"\n** End of Experimental AMSAC Compression Session\n") ;

delete pCIO ;                   // delete CIO instantiation

}
// Tuesday, 5-30-95
// This is an implicitly virtual function, as define in AHUFF.H as virtual
```

SA9-94-067                              A8

```
// ?? initialization of ArithSession to Huffman
//   cone has to have more than 40% weight to be in arithmetic code void CAMSAC :: InitializeNodes (void) // initialize sibling nodes
        {
        int i;

pNode[ sRootNode ].sChild = sRootNode + 1; // pointer to left child
        pNode[ sRootNode ].fLeaf  = FALSE;  // I am not a leaf node
        pNode[ sRootNode ].lWeight = 2;   // I have two children
        pNode[ sRootNode ].sParent  = -1;  // I am a root, I have no parent pNode[ sRootNode + 1 ].sChild = usEndOfStream; // 1st left child
        pNode[ sRootNode + 1 ].fLeaf = TRUE;        // I am a leaf
        pNode[ sRootNode + 1 ].lWeight = 1;              // the weith always be 1
        pNode[ sRootNode + 1 ].sParent = sRootNode; // parent is root
        psLeaf[ usEndOfStream ] = sRootNode + 1;             // leaf points to pNode[ sRootNode + 2 ].sChild = usEscape;
        pNode[ sRootNode + 2 ].fLeaf = TRUE;
        pNode[ sRootNode + 2 ].lWeight = 1;
        pNode[ sRootNode + 2 ].sParent  = sRootNode;
        psLeaf[ usEscape ] = sRootNode + 2; // leaf points to Node sNextFreeNode = sRootNode + 3; // next free node is location 3 for ( i = 0 ; i < usEndOfStream ; i++ ) // 0 thru 255 for xmp
                    psLeaf[ i ] = -1;    // -1 denotes no symbol or leaf yet
        }
```

/**

CAMSAC::EncodeSymbol ( const unsigned short usSymbol ) ;

10-10-1995

The EncodeSymbol member function is brought over from CAHUFF
    - Amazingly, the code compiled and worked with minor addition of
        virtual to original member function and CAMSAC header
    - The arithmetic encoding is intended to add into here 5-26-1995 Friday

SA9-94-067                A9

This routine takes a symbol and converts it into right-aligned
Huffman codeword.
Please note the Huffman tree is stored as Sibling list.
Also note, when a new symbols is introduced, the ESCAPE codeword
will first be generated. Then the new symbols is coded as "raw", in
its original form.

Important Notes for future updates !!!
- NOTE 1: this could potentially be a problem as the symbol size
          varies from 1 .. n bits. The part of code should be revised later.
- NOTE 2: problem with updating Huffman tree
        * the tree should be updated when it hits certain depth
               rather then the total number of count reach a Fibonacci number 10-11-95 Wednesday

- The version 4 AMSAC, 10-10, had major clean-ups on pCIO->Msg;
    pCIO->Trace; the print Huffman Format now includes the reordered
    arithmetic symbol list. The intent is to add the multiple-symbol
    arithmetic coder and have it be ableto interplay with the backbone
    Huffman encoding.
-

\*\*/

/\*\*\*\*

EncodeSymbol member function block diagram    10-11-95 Wednesday

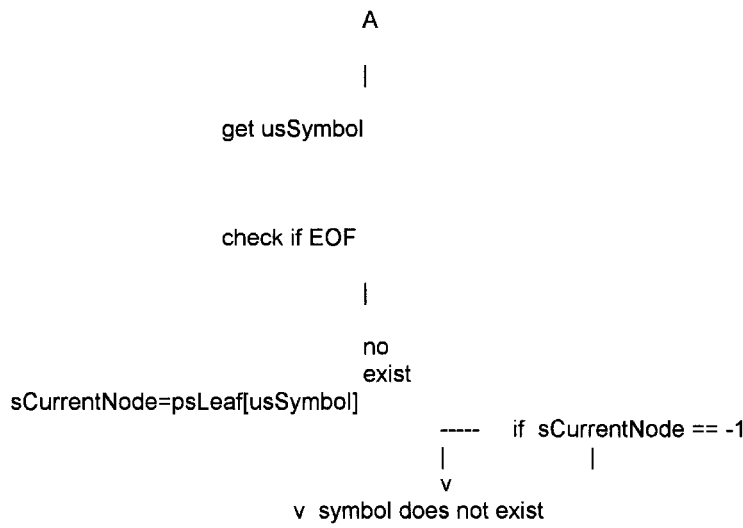

```
                              A
                              |
                         get usSymbol check if EOF

|
                             no
                           exist
sCurrentNode=psLeaf[usSymbol]
                                     -----   if sCurrentNode == -1
                                       |            |
                                       v
                              v  symbol does not exist
```

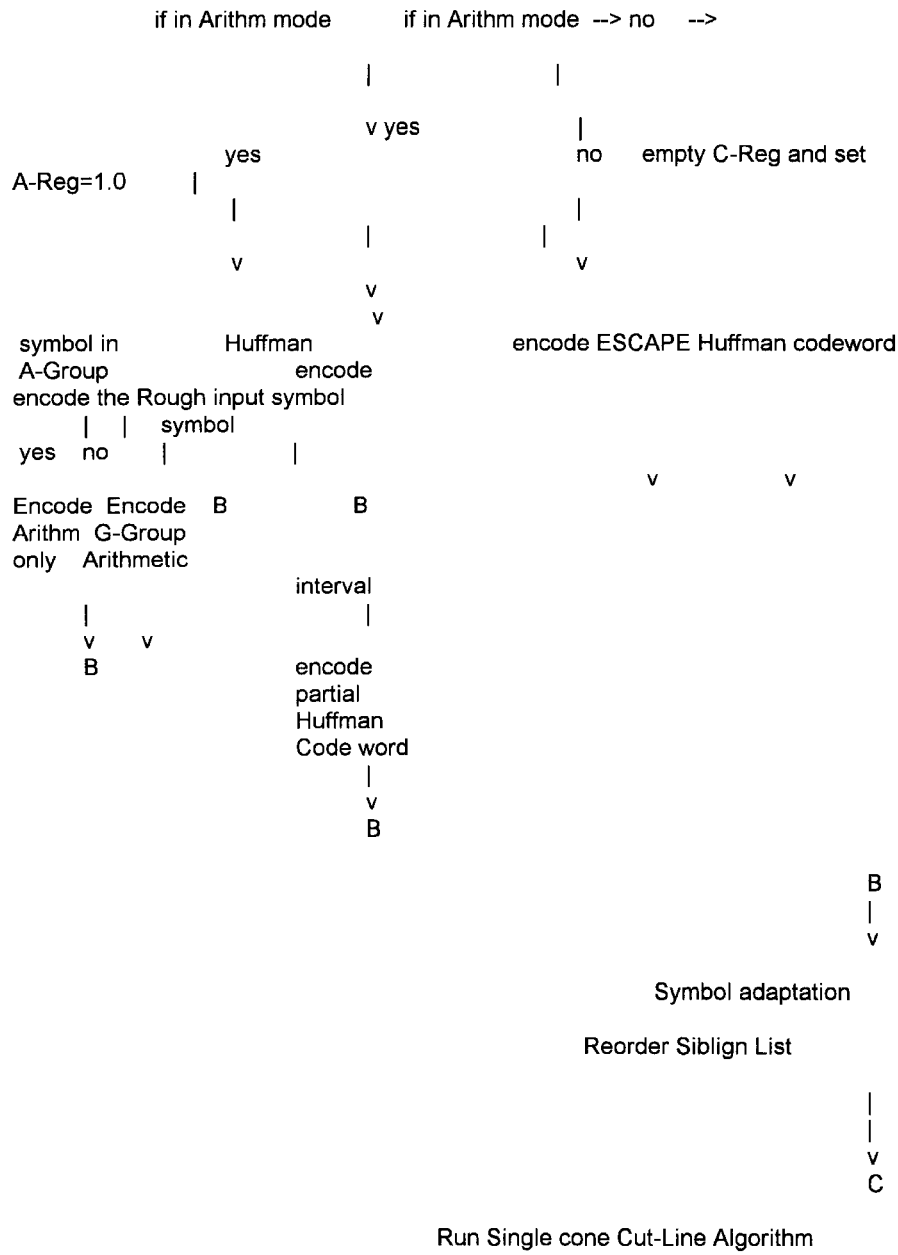

```
                                        Was the Arithmetic Mode
              ------------------------------------------
              was on              was off
                |                    |
                v                    v
New: to turn on  to turn-off   New: to turn-on   to turn off
---------------  -----------   ---------------   ---------- do nothing  empty C-Reg    reset A=1.0     do nothing
                                     C=0.0

|
    |
    v
    A

****/ void CAMSAC::EncodeSymbol
    (
            const unsigned short usSymbol
    )
{
    unsigned long ulCode = 0L ;
    unsigned long ulMaskBit = 1L ;
    short   sCodeSize = 0 ;
    short   sCurrentNode ;
    sCurrentNode = psLeaf[ usSymbol ];   // look for leaf on sibling list
    if ( sCurrentNode == -1 )            // check if symbol does not exist
            sCurrentNode = psLeaf[ usEscape ];

// generate Huffman code right to left
            // 10-10-95, for AMSAC: while (sCurrentNode !=
Arithm.sSingleSubTreeNoe)
```

```
        while ( sCurrentNode != sRootNode )
        {
        if ( ( sCurrentNode & 1 ) == 0 )    // even node, right child
                ulCode |= ulMaskBit;          // code as '1'
        ulMaskBit <<= 1;            // shift the mask bit one position left
        sCodeSize++;            // increase code size by one
        sCurrentNode = pNode[ sCurrentNode ].sParent; // traverse up to root
        } pCBitOutput->OutputBit ( ulCode, sCodeSize );
                    // to code the current Huffman code; please note the ulCode
is
                    // right-aligned, with its effective size as sCodeSize if ( sCodeSize == MAX_DEPTH ) RebuildTree (); // new code!! untested!!

if ( psLeaf[ usSymbol ] == -1 )  // symbol is new
        {
        pCBitOutput->OutputBit ( (unsigned long) usSymbol, 8 );
                // warnign! symbol size is 8, should be a variable
        AddNewNode ( usSymbol );
        }
}
```

```
/* Wednesday 5-31-95
        Saturday  6-3-95    Compliled

Single SubTree Detection Function is not very staightforward. Luckily I
        was able to find efficient solutions. The required functions are:
        - To partition the Huffman tree into two parts:
                1. the AGroup, where symbols will be coded in Arithmetic form
                2. the HGroup, where symbols will be coded in Huffman form
                3. All AGroup symbols are of higher probabilities symbols;
                4. The maximal number of AGroup symbols is m
                5. All HGroup Huffman symbols can be rooted by a single internal
                        node.
                6. Further, for AGroup symbol to be coded in the arithmetic form,
```

SA9-94-067                                              A13

AGroup should have some sizabel weight. In this exercise, only
50% is needed (this should be modified later). If the condition is
met, then, the function should turn on the Arithmetic Flag ;
7. In addition, it should reorder the symbols as:

arithmetic symbol [Most probable]
arithmetic symbol [next most probable]
arithmetic symbol [..]
arithmetic symbol [Least probable]
arithmetic sybbol [Huffman group]

- The tasks is to find the cut line of AGroup and HGroup
- To identify whether single cone exist,
- If exist, then test the weight ratio
- reorder the symbol I have considered two algorithmic approaches:

- A brut-force way to travers the tree and uses state machine:
- A simpler way based on graph theory and proof of contridition Other requirements:
1. Arithm.psSymbol = new short [ size of m + 1 ] ;
2.

*/

```
short CAMSAC :: SingleSubTreeDetect
    (
        ArithmType& Arithm       // call-by-reference not by-value
    )
    {
    short i ;  // scan line pointer
                                 // short sOutDegree ;  also for symbol swapping for (i=1, Arithm.sSymbolTotal =0, Arithm.sAGroup = 0, sOutDegree=2 ;
                (i < Arithm.sNodeLimit) && (i < sNextFreeNode) ;
                i ++)

// scan line algorithm
            {                        // needs more rigorous proof
```

SA9-94-067                      A14

```
              if ( pNode [i].fLeaf == TRUE )
                  {
                  sOutDegree -- ;
                  if ( sOutDegree <= 2)
                      {
                      Arithm.sAGroup = i ;        // record a possible cut-point
                      sCutPointOutDegree = sOutDegree ;
                      }

// collect the arithmetic symbols

Arithm.psSymbol[Arithm.sSymbolTotal++] = pNode [i].sChild ;

if ( sOutDegree == 0 ) // exception, added
                      {
                      Arithm.fArithmOnlyMode = TRUE ;      // every symbol is in
arithm Arithm.sSingleSubTreeNode = sNextFreeNode ; //

PrintHuffmanNodes (Arithm.sAGroup) ; // this print is OK'd return (Arithm.sSymbolTotal) ;    // return to the calling
function
                      }

}
              else
                  {
                  sOutDegree++ ;     // for an internal node, sub degree 1, adds 2,
net +1
                  if ( sOutDegree <= 2)
                      {
                      Arithm.sAGroup = i ;  // make a record
                      sCutPointOutDegree = sOutDegree ;
                      }
                              // ?    Arithm.psSymbol[Arithm.sSymbolTotal++] =
pNode [i].sChild ;
                  }

}

// to find out which node has forwarding arc across the cut
         // the trick is to move next cell, then use its back pointer to find out Arithm.sSingleSubTreeNode = pNode [Arithm.sAGroup+1].sParent ;
```

```
                                    // proof, by contridictionr
                                    // implied Huffman symbol: Arithm.Symbol[j] =
sLeakNode ;

Arithm.psSymbol[Arithm.sSymbolTotal++] =Arithm.sSingleSubTreeNode ;

PrintHuffmanNodes (Arithm.sAGroup) ; // was buggy!

return ( Arithm.sSymbolTotal) ;

}

/*
        Saturday, 6-3

List Sibling List ( end element node)

This function prints the sibling node list (Huffman Tree) from node
        0 to node EndNode .

- Node 0 is root
        - Leaf node has CNode[i].sChild as symbol
        - Internal node, has CNode[i].sChild as child pointer to the left
                sibling (the more probable sibbling)

*/
short CAMSAC :: PrintHuffmanNodes (const short sEndNode )
        {
        short i, j ;
        char cLine[120] ;

if (!Arithm.sSingleSubTreeNode)
                {
                sprintf (cLine, "..All Huffman Encoding; weight: %6li", pNode[0].lWeight ) ;
                pCIO->Trace (cLine," ") ;
                return (sEndNode) ;
                } sprintf (cLine, "Root is node 0;weight: %6li", pNode[0].lWeight ) ;
        pCIO->Trace (cLine," ") ;
```

```
for (i=1 ; (i<sNextFreeNode) && (i<=Arithm.sNodeLimit+3); i++)
{
    if (pNode [i] .fLeaf == TRUE )
        {
        sprintf (cLine, "%4i node, is Leaf; parent: %4i; Symbol: %4i,weight %8li",
                i, pNode[i].sParent, pNode[i].sChild , pNode[i].lWeight ) ;
        pCIO->Trace (cLine," ") ;
        }
    else
        {
        sprintf (cLine, "%4i Internal Node; parent: %4i; Child : %4i,weight %8li",
                i, pNode[i].sParent, pNode[i].sChild , pNode[i].lWeight ) ;
        pCIO->Trace (cLine," ") ;

}
    if (i==sEndNode) pCIO->Trace ("____Starts Huffman Group"," ") ;

sprintf (cLine,"\n") ; // 10-9-95 dummy sprintf, test use, take out later

} sprintf (cLine,"AGroup:%4i; NodeLimit:%4i; NextFreeNode:%4i; ",
    Arithm.sAGroup, Arithm.sNodeLimit, sNextFreeNode );
pCIO->Trace(cLine," ") ;

if (sNextFreeNode == Arithm.sAGroup+1)
    pCIO->Trace ("____HGroup is NULL; ","All nodes are in A-Group") ;
else
    {
    sprintf (cLine,
        "SingleSubTreeNode:%4i ;CutPointOutDegree is:%4i, OutDegree is:%4i",
            Arithm.sSingleSubTreeNode,sCutPointOutDegree, sOutDegree); // buggy!!

pCIO->Trace(cLine," ") ;
    }

//was if ((j = sEndNode + 1) < sNextFreeNode)
j = sEndNode + 1 ;          // replacement
if (j < sNextFreeNode)      // replacement
```

```
        {
        pCIO->Trace("____1st node after the cutline in HuffmanGroup..","") ;
        if (pNode [j] .fLeaf == TRUE )
                {
                sprintf (cLine, "%4i node, is Leaf; parent: %4i; Symbol: %4i, weight
%6li",
                        j, pNode[j].sParent, pNode[j].sChild , pNode[j].lWeight ) ;
                pCIO->Trace (cLine," ") ;

}
        else
                {
                sprintf (cLine, "%4i Internal Node; parent: %4i; Child : %4i,   weight
%6li",
                        j, pNode[j].sParent, pNode[j].sChild , pNode[j].lWeight ) ;
                pCIO->Trace (cLine," ") ;

}
        }

// 10-10-95 added to see the Arithmetic symbols order for (j=0; j < (Arithm.sSymbolTotal-1); j++)
        {
        sprintf (cLine,"   Arithm_Symbol %4i is: %4i",j,Arithm.psSymbol[j]) ;
        pCIO->Trace(cLine,"") ;
        } if (Arithm.sSymbolTotal>0)

{
        sprintf (cLine,"   Last Arithm_Symbol is a H-GROUP at location: %4i",
                Arithm.psSymbol[Arithm.sSymbolTotal-1]) ;
        pCIO->Trace(cLine,"") ;
        }
pCIO->Trace("\n","") ;

return i ;

}
```

/***************** End of CAMSAC.CPP *******************/

```c
/********************* Start of AHUFFCLH.H *************************/
#include "cbitio_h.h"

#ifndef _AHUFFCLS_H
define _AHUFFCLS_H define FLAG        short
define TRUE        1
#define FALSE       0
#define MAX_DEPTH   20

// const char *CompressionName = "Adaptive Huffman coding, with escape codes";
const short sRootNode = 0 ;

typedef struct NodeType
{
        long  lWeight;  // changed from ui 6-3-95
        short sParent;
        short sChild ;  // pointer to child; store the symbol when is a LEAF node.
        FLAG  fLeaf ;   // was int child_is_leaf, really is am I a leaf.
                        // to change to boolean
type later
} NODETYPE ;

long lFileSize ( char * cFileName ) ;

class CAHuffmanTree
{
public:

CAHuffmanTree
            (
                    unsigned short usSymbolSize
            ) ;
                                // 5-24, init var consts virtual void InitializeNodes ( void );    // 5-24 initialize sibling nodes virtual void CompressFile
            (
                    char* cSourcFile,
                    char* cCodedFile,
                    char* cReport
            );
```

```
        virtual void DecompressFile
                (
                        char* cCodedFile,
                        char* OriginalFile,
                        char* cReport
                );

virtual void EncodeSymbol                       // 10-10-95, change
to virtual
                (                       // the CAMSAC has its own version
                        const unsigned short usSymbol
                );

unsigned short DecodeSymbol
                (
                        void
                );
        void UpdateModel
                (
                        unsigned short usSymbol
                );

void RebuildTree
                (
                        void
                );

void SwapNodes
                (
                        short i,
                        short j
                );

void AddNewNode
                (
                        const unsigned short usSymbol
                );

protected:

FILE* fInput ;                                  // a text input, but binary read
open
        FILE* fOutput ;         // text write output file
        FILE* fReport ;         // append open write text file
        CIO * pCIO ;
        CBitOutput* pCBitOutput ; // pointer to CBitOutput coded file
        CBitInput*  pCBitInput ;  // pointer to CBitInput coded file
```

```
        NODETYPE *  pNode ;     // pointer, pCNode[size*2 + 1 ]
    short* psLeaf ;                                      // array piLeaf[
Symbol_Count ]

short sNextFreeNode ;

// the following vars to be used as constants unsigned short usEndOfStream ; // was #define END_OF_STREAM   256
    unsigned short usEscape ;     // was #define ESCAPE         257
    unsigned short usSymbolCount ; // was #define SYMBOL_COUNT   258
    unsigned short usNodeTableCount ;
                                    // was #define NODE_TABLE_COUNT
( ( SYMBOL_COUNT * 2 ) - 1 )
    // unsigned short usRootNode ;   was #define ROOT_NODE       0

};                                                   // end of CHuffmanTree
class endif /* _AHUFF_H */

/******************* End of AHUFFCLH.H *************************/
```

/***************** Start of AHUFFCL.CPP**********************/

```cpp
#include <stdio.h>
include <stdlib.h>
include <string.h>
include <ctype.h>
#include <iostream.h>
include <assert.h> include "cio_h.h"
include "cahuff_h.h"

// 5-24-95
//

CAHuffmanTree::CAHuffmanTree (unsigned short usSymbolSize )
{
    usEndOfStream = usSymbolSize ;
    usEscape = usSymbolSize + 1 ;
    usSymbolCount = usSymbolSize + 2 ; // symbol & Escape &
EndOfStream usNodeTableCount = 2 * usSymbolCount - 1 ; // include
internal nodes
    // usRootNode = 0 ;

psLeaf = new short [ usSymbolCount ] ;          //
instantiation made
                                    // to add
defensive code later, check pointer NULL
    pNode = new NODETYPE [ usNodeTableCount ] ; //
instantiation made
                                    // to add
defensive code later, check pointer NULL
}

// WAS: void InitializeTree(TREE* tree )
// Wednesday 5-14-95 void CAHuffmanTree::InitializeNodes (void) // initialize sibling
nodes
{
    int i;

pNode[ sRootNode ].sChild = sRootNode + 1; // pointer to
left child
    pNode[ sRootNode ].fLeaf  = FALSE;  // I am not a leaf node
    pNode[ sRootNode ].lWeight = 2;    // I have two children
```

```
    pNode[ sRootNode ].sParent = -1;   // I am a root, I have
no parent pNode[ sRootNode + 1 ].sChild = usEndOfStream;  // 1st left
child
    pNode[ sRootNode + 1 ].fLeaf = TRUE;        // I am a
leaf
    pNode[ sRootNode + 1 ].lWeight = 1;         // the weith
always be 1
    pNode[ sRootNode + 1 ].sParent = sRootNode; // parent is
root
    psLeaf[ usEndOfStream ] = sRootNode + 1;    // leaf
points to pNode[ sRootNode + 2 ].sChild = usEscape;
    pNode[ sRootNode + 2 ].fLeaf = TRUE;
    pNode[ sRootNode + 2 ].lWeight = 1;
    pNode[ sRootNode + 2 ].sParent = sRootNode;
    psLeaf[ usEscape ] = sRootNode + 2; // leaf points to Node sNextFreeNode = sRootNode + 3;  // next free node is location
3 for ( i = 0 ; i < usEndOfStream ; i++ ) // 0 thru 255 for
xmp
        psLeaf[ i ] = -1;    // -1 denotes no symbol or
leaf yet
} void CAHuffmanTree::CompressFile
    (
        char* cOriginalFile,
        char* cCodedFile,
        char* cReport
    )

{ unsigned short usSymbol ;
    float fCompressionRatio ;
    char Msg[80] ;

pCIO = new CIO (cReport) ;   // instantiation made

// need to add defensive checker for pointer
    if ((fInput = fopen (cOriginalFile, "rb")) == NULL)
            pCIO->Crash ("Error READ open binray input file",
```

```
97);

pCBitOutput = new CBitOutput (cCodedFile) ; // open
CodedFile
                                // needs to add
defensive checker for pointer
    sprintf  (Msg,
        "\n** Source: %s ; coded output: %s ; \n  symbols size
is: %4i\n",
        cOriginalFile, cCodedFile, usEndOfStream) ;

pCIO->Msg("Starts Adaptive Huffman Compression Session",Msg)
;

InitializeNodes();
    while ( ( usSymbol = getc( fInput ) ) != EOF )
        {
        EncodeSymbol( usSymbol);
        UpdateModel( usSymbol );
        }
    EncodeSymbol( usEndOfStream );

delete pCBitOutput; // this is necessary to properly end the
compression
                                // as
output buffer rack may still have code residu.
                                // the
output bit file will be closed
    fclose (fInput) ;   // close input original file // this section is entered assuming that both input and
output
    // files for compression are closed !!

if (lFileSize (cOriginalFile) > 0)
        fCompressionRatio =
            ((float) lFileSize(cCodedFile)) / ((float)
lFileSize(cOriginalFile)) ;

sprintf (Msg,"Compression Ratio is %8.3f
bits/char",8*fCompressionRatio) ;

pCIO->Msg (Msg,"\n** End of Adaptive Huffman Compression
Session\n") ;
```

}

/**
   5-26-1995 Friday

This routine takes a symbol and converts it into
right-aligned
   Huffman codeword.
   Please note the Huffman tree is stored as Sibling list.
   Also note, when a new symbols is introduced, the ESCAPE
codeword
   will first be generated. Then the new symbols is coded as
"raw", in
   its original form.

Important Notes for future updates !!!
   - NOTE 1: this could potentially be a problem as the symbol
size
      varies from 1 .. n bits. The part of code should be
revised later.
   - NOTE 2: problem with updating Huffman tree
      * the tree should be updated when it hits certain depth
         rather then the total number of count reach a
Fibonacci number 10-11-95 Wednesday

- The version 4 AMSAC, 10-10, had major clean-ups on
pCIO->Msg;
      pCIO->Trace; the print Huffman Format now includes the
reordered
      arithmetic symbol list. The intent is to add the
multiple-symbol
      arithmetic coder and have it be ableto interplay with
the backbone
      Huffman encoding.
   -

**/ void CAHuffmanTree::EncodeSymbol
    (
        const unsigned short usSymbol
    )
    {
    unsigned long ulCode = 0L ;
    unsigned long ulMaskBit = 1L ;

SA9-94-067                                    A25

```
    short   sCodeSize = 0 ;
    short   sCurrentNode ;

// were: ulCode = 0;    ulMaskBit = 1; sCodeSize
= 0;

sCurrentNode = psLeaf[ usSymbol ];  // look for leaf on
sibling list
    if ( sCurrentNode == -1 )           // check if symbol
does not exist
            sCurrentNode = psLeaf[ usEscape ];

// generate Huffman code right to left
    // 10-10-95, for AMSAC: while (sCurrentNode !=
Arithm.sSingleConeNoe)

while ( sCurrentNode != sRootNode )
        {
        if ( ( sCurrentNode & 1 ) == 0 )  // even node, right
child
            ulCode |= ulMaskBit;          // code as '1'
        ulMaskBit <<= 1;                  // shift the mask bit one
position left
        sCodeSize++;                      // increase code size by one
        sCurrentNode = pNode[ sCurrentNode ].sParent;  //
traverse up to root
        } pCBitOutput->OutputBit ( ulCode, sCodeSize );
            // to code the current Huffman code; please
note the ulCode is
            // right-aligned, with its effective size as
sCodeSize if ( sCodeSize == MAX_DEPTH ) RebuildTree ();  // new code!!
untested!!

if ( psLeaf[ usSymbol ] == -1 )   // symbol is new
        {
        pCBitOutput->OutputBit ( (unsigned long) usSymbol, 8 );
            // warnign! symbol size is 8, should be a
variable
        AddNewNode ( usSymbol );
        }
    }
```

```
/* Friday, 5-26-95

AddNewNode ( newSymbol )

- Add new symbol to the sibling tree

- The new node introduced has weight 0
    - The updating of weight is done at a later stage. This is
consistent
        with the case when the symbol is already in existense.
    - Use nice Nelson's algorithm
        * The new node introduced and the current lightest
wight node
            will be the new children to the old
lightest-weight node
        * Note, since the new node has 0 weight, the prior
lightest weight
            node will have the weight preserved. Such, the
sibling property
            can not be vilated.
*/ void CAHuffmanTree::AddNewNode
    (
        const unsigned short usSymbol
    )
{
    short sLightestNode;
    short sNewNode;        // new left child
    short sZeroWeightNode; // also new right child sLightestNode = sNextFreeNode - 1;       // last
position - 1 is the lightest
    sNewNode = sNextFreeNode;
// left child
    sZeroWeightNode = sNextFreeNode + 1;   // right child
    sNextFreeNode += 2;                    // new next free node
is +2 position pNode[ sNewNode ] = pNode[ sLightestNode ]; // 1st make two
CNode equal
    pNode[ sNewNode ].sParent = sLightestNode;
    psLeaf[ pNode[ sNewNode ].sChild ] = sNewNode; // really is
psLeaf[symbol]

pNode[ sLightestNode ].sChild = sNewNode; // points to left
child only
```

```
                // as the right child is sibling
    pNode[ sLightestNode ].fLeaf = FALSE;
                // no longer is leaf node, mark the flag off,
or mark it as internal pNode[ sZeroWeightNode ].sChild = usSymbol ;
                // since this is the leaf node, the sChild
stores the symbol instead
    pNode[ sZeroWeightNode ].fLeaf  = TRUE; // confirm this is
a leaf node
    pNode[ sZeroWeightNode ].lWeight = 0;
                // the weight will be increase to 1, when
updating the model pNode[ sZeroWeightNode ].sParent = sLightestNode;

psLeaf[ usSymbol ] = sZeroWeightNode;

}

/*
Friday, 5-26-95

UpdateModel
- increment the count for a given symbol.
    * After incrementing the symbol, this code has to work its
way up
        through the parent nodes, incrementing each one of
them.
    * In case of the sibling property is not preserved:
        that is the left nodes (toward root) has less weight,
        the current node would need to swap with the lead of
less node.
*/ void CAHuffmanTree::UpdateModel( unsigned short usSymbol )
    {
    short sCurrentNode;
    short sNewNode;
    sCurrentNode = psLeaf[ usSymbol ];
    while ( sCurrentNode != -1 )
        {
            // -1 is the parent of root
        pNode[ sCurrentNode ].lWeight++;  // increase the
current weigth by 1
```

```
                // check to see if the sibling property
preserved
                // the nodes to the left have to be of equal
or greater weight for ( sNewNode = sCurrentNode ; sNewNode > sRootNode ;
sNewNode-- )
            if ( pNode[ sNewNode - 1 ].lWeight >=
                        pNode[ sCurrentNode
].lWeight ) break;

// swap the current node with the left most
node of the same weight
        if ( sCurrentNode != sNewNode )
            {
            SwapNodes ( sCurrentNode, sNewNode );
            sCurrentNode = sNewNode;
            }
        sCurrentNode = pNode[ sCurrentNode ].sParent;

// propagate weight increase to its parent
        }
    }
```

/* Saturady, 5-27-95

Swapping nodes
Swap node function has two crutial indications:
1. It can drastically change the shape of the tree reflecting by
    the sibling list.
2. It needs to minimize the surgery strike to ensure the
efficiency.

- It takes place when a node has grown bigger that sibling
property
    is no longer preserved.
- The exchange is made between the current bigger node, and lead
    (one closest to the root) of the smaller weighted node.
- i is the bigger one to move to j, the pack lead of the smaller
one.

10-8-95 Sunday. There are two ways to do the swap properly:
    1. Before increment the weight of the node, find the
node closest to
        the root with the same weight; if such node

```
exists, swap with
         that node; then increment the weight of the node.
The parent of
         the node will need to add 1 to its weight, but,
does the same
         recursion of swap first then does weight
increase.
    2. First increase the weight, then if the sibling
property is vialated,
         swap with the leading node (closest to the root)
which has weight
         one less (swap if such node exist). Nelson
implemented the 2nd
         method, and it seems swaping more often than
needed.

*/ void CAHuffmanTree:: SwapNodes (short sBigNode, short sSmallNode
)
  {
  NODETYPE tempNode;

// the following codes take care of the children
first
         // the children need to point to its new parent
         // the simple case is when the node itself is a
leaf if ( pNode[ sBigNode ].fLeaf ) // in leaf case, .sChild has
the symbol
         psLeaf[ pNode[ sBigNode ].sChild ] = sSmallNode;
    else
      {    // in non-leaf case, both children have to
point to new parent
      pNode[ pNode[ sBigNode ].sChild ].sParent = sSmallNode;
// left child
      pNode[ pNode[ sBigNode ].sChild + 1 ].sParent =
sSmallNode;// right child
      } if ( pNode[ sSmallNode ].fLeaf )
         psLeaf[ pNode[ sSmallNode ].sChild ] =
sBigNode;
    else
      {
      pNode[ pNode[ sSmallNode ].sChild ].sParent = sBigNode;
```

```
            pNode[ pNode[ sSmallNode ].sChild + 1 ].sParent =
sBigNode;
        }

// the following codes are the actually swapping of the
two nodes
        // the code has to correct the parent pointers
        // the child points are correct already.

tempNode = pNode[ sBigNode ];
    pNode[ sBigNode ] = pNode[ sSmallNode ];

pNode[ sBigNode ].sParent = tempNode.sParent;
    tempNode.sParent = pNode[ sSmallNode ].sParent;
    pNode[ sSmallNode ] = tempNode; // small node now has the
bigger weight

}

/* Saturday, 5-27
    Decompression function entry
    File interfaces:
    - input: CodedFile (open as binary input file)
    - output: Text/Binary output (supposed to be identical to
the original)
    - pCIO:  report message and crash IO interface the code structure is very similar to compression code
*/ void CAHuffmanTree::DecompressFile
            (char* cCodedFile, char* cOriginalFile,
char* cReport)
    {
    unsigned short usSymbol ;
    char Msg[80] ;

// if ((fReport = fopen (cReport, "a")) == NULL) {
    //    cout << "\n Can not append open report file, program
will crash!" ;
    //    exit (94) ;
    // }
    pCIO = new CIO (cReport) ; // instantiation made, need to
check NULL
```

```
    if ((fOutput = fopen (cOriginalFile, "wb")) == NULL)
        pCIO->Crash ("Error Write open original file", 93)
;

pCBitInput = new CBitInput (cCodedFile) ; // open CodedFile
                            // needs to add
defensive checker for pointer sprintf  (Msg,
         "\n** Coded Source : %s ; output: %s ; \n   symbols
size is: %4i\n",
            cCodedFile, cOriginalFile, usEndOfStream) ;

pCIO->Msg("Starts Adaptive Huffman Decompression
Session",Msg) ;

InitializeNodes();

while ( ( usSymbol = DecodeSymbol( ) ) != usEndOfStream )
       {
       if ( putc( usSymbol, fOutput ) == EOF )
            pCIO->Crash ( "Error writing character", 92
);
       UpdateModel ( usSymbol );
       } delete pCBitInput ;  // close intput binary file
    fclose (fOutput) ;   // close output decoded original file pCIO->Msg ("End of Adaptive Huffman Decompression
Session","") ;

}
/*
Decoding symbols
- Starts at the root node, traverse down the tree till reching a
leaf
- At leaf, retrive the symbol:
    * if the symbols is Escape, then next 8 bits are actual
"raw" symbol
    * else, the current symbol is valid and return it.
```

SA9-94-067             A32

```
*/ unsigned short CAHuffmanTree::DecodeSymbol( void )
    {
    short sCurrentNode;
    unsigned short usSymbol ;

sCurrentNode = sRootNode;
    while ( !pNode[ sCurrentNode ].fLeaf )
        {
        sCurrentNode = pNode[ sCurrentNode ].sChild;
        sCurrentNode += pCBitInput->InputBit( );
        }
    usSymbol = pNode[ sCurrentNode ].sChild;

if ( usSymbol == usEscape )
        {
        usSymbol = (unsigned short ) pCBitInput->InputBit ( 8
);
        AddNewNode ( usSymbol );
        }
    return( usSymbol );
    } void CAHuffmanTree::RebuildTree( void )
    {
        // rebuild the Huffman tree
    } long lFileSize (char * cFileName)
    {
    // return file size
    }

/********************* End of AHUFFCL.CPP *********************/
/********************** Start of io_cls_h.h **********************/
    IO_CLS_H.H
    This class encapsulates the message and crash functions.
    Each function prints two copies: a stored report file and screen msg.
        - Use constructor to pass file ptr in, for example:
                    pIOClass = new IOClass (fpReport )
        - Need to add check: if (pIOClass == NULL) normal crash ;
*/
#ifndef _IOCLS_H
#define _IOCLS_H
#include <iostream.h>
#include <fstream.h>
```

```
include <stdlib.h>    // exit, reand, system, malloc, atof, toupper class CIO {
public:
        CIO (char * cOutPutFileName) ;       // constructor, pass in file name and to open the file
        void Crash (char *Msg, long ExitCode) ;
        void Msg (char *Msg1, char *Msg2) ;
        void Trace (char *Msg1, char *Msg2);
        ~CIO ();        // need to write destructor private:
        ofstream * pOutFile ;
        ofstream * pChkOfs ;
        char cLog1[200], cLog2[200] ;
        pOutFile is point to class ofstream
        FILE * fpReport ; // report file pointer, passed in during construction
} ;
#endif // _IOCLS_H
/*********************** End of io_cls_h.h ***********************/
```

```
/**
    CIO.CPP         Saturday, 10-7-95 was named prior: IO_CLS.CPP, Sunday, 3-12-95

IOClass supports two functions:
    - IOClass::Crash()
    - IOClass::Msg() functions Each function prints two copies: a stored report file and screen msg.
    - Use constructor to pass file ptr in, for example:
            pIOClass = new IOClass (fpReport )
    - Need to add check: if (pIOClass == NULL) normal crash ;

10-7-95 SAT: remove stdio.h added iostream.h and fstream to use
                                    more standard c++ << rather than fprint

**/

// 10-7-95 #include <stdio.h> fopen, feof (for open binary), fputs include "cio_h.h"
include <string.h>      // 10-9-95 messy code, remove later

CIO::CIO (char * cOutPutFileName )

// constructor to pass in file ptr
{
        pOutFile = new ofstream (cOutPutFileName, ios::out) ; // test code pChkOfs = pOutFile ;

// 10-7-95 very buggy
                        // the class pointer seems to be corrupting very quickly
        // ofstream pOutFile ( cOutPutFileName, ios::out ) ; instantiation made
        if ( !pOutFile )
                {
                cerr << "CIO.C++, pOfstream point passed in is NULL" ;
                exit (9999) ;
                }
}
void CIO::Crash (char * Msg, long lExitCode)
{
        *pOutFile << "\n** Program will crash" << Msg << lExitCode ; // buggy!!

cerr << "\n** Program will crash" << Msg << lExitCode ;
```

```cpp
        // printf ("\n** program will crash: %s; Exit code: %6li", Msg, IExitCode) ;
        // fprintf (fpReport,"\n** program will crash: %s; Exit Code:",
        //         Msg, IExitCode) ;
        exit (IExitCode) ;    // program end, a forced exit
} void CIO::Msg (char * Msg1, char * Msg2)
{
        *pOutFile << "\n** MSG: " << Msg1 << Msg2 ;    // buggy ! 10-7 pointer null!
        cerr << "\n** MSG: " << Msg1 << Msg2 ;

}

/**
        CIO::Trace has the same function as CIO::Msg
        - Trace does not print copy to screen other than exceptions
**/ void CIO::Trace (char * Msg1, char * Msg2)
{
        if (Msg1 && Msg2)
                {
                if (pChkOfs!=pOutFile)
                        {
                        cerr << "pointer corrupted by:" << cLog1 << "; and by: " << cLog2 << endl ;
                        pOutFile = pChkOfs ;
                                // bad code of fixing corrupted pointer, but worked!!
                        exit (1000) ;
                        }

// strcpy (cLog1, Msg1) ;
                // strcpy (cLog2, Msg2) ;

*pOutFile << "\n** MSG: " << Msg1 << Msg2 ;  //
                }
        else cerr << "CIO->Msg pointer Null" ;

// test code
        // if (pChkOfs != pOutFile)
        //         cerr << "ofstream pointer corrupted" << Msg1 << Msg2 << endl ;

}
```

```
CIO::~CIO ( )
                // constructor to pass in file ptr
{
    delete pOutFile ;
}
```

```
/*********************** Start of BITIO.H ***********************/
#ifndef _CBITIO_H
#define _CBITIO_H
#include "cio_h.h"
class CBitFile
{
public:
        void PassInCIOPtr (CIO * CIOPtr) {pCIO = CIOPtr; } ; protected:
        FILE* fBitFile ;        // file pointer to bit file
        short sMask ;   // output bit mask, right most 8 bits are used
                        // left most bit is more significant
        short sRack;    // output bit buffer, right most 8 bits are used
        short sPacifierCounter;   // used for reporting the progress of execution
        CIO * pCIO ;    // need to pass class IO pointer in for crash/msg
} ;
class CBitOutput : public CBitFile
{
public:
        CBitOutput ( char* cFileNameToOpenAsOuput );    // constructor
        void  OutputBit ( short sBit );
        void    OutputBit ( unsigned long lCode, int iCount );
                        // changed from OutputBits for overloading
        ~CBitOutput (void );                            // destructor} ;
class CBitInput : public CBitFile
{
public:
        CBitInput ( char* cFileNameToOpenAsInput );
        int  InputBit( void );
        unsigned long InputBit (int iBitCount );
                        // changed from InputBits for overloading
        ~CBitInput ( void );
} ;
#endif /* _BITIO_H */
/*********************** End of BITIO.H ***********************/
```

/************************* Start of CBITIO.C *************************

10-7-95 - added the new cio_h.h with << for msg and crash

**/

```c
#include <stdio.h>
include <stdlib.h>
#include "cio_h.h"
#include "cbitio_h.h"

CBitOutput :: CBitOutput ( char* cBitOutput )

// open bitfile and base CBitFile
    {
    // open output file in write binary mode
    }

CBitOutput :: ~CBitOutput ( )
    {
    // close output file
    } void CBitOutput :: OutputBit (short sBit)
    {
    // output single bit
    }

// This member function allows to shift multple bits, the bit
// length is specified by iCount void CBitOutput ::OutputBit (unsigned long lCode,int iCount )
    {
    // output multiple bits
    }

CBitInput :: CBitInput (char* cFileNameToOpenAsInput)
    {
    // open input file in read binary mode
    }

CBitInput :: ~CBitInput (void)
    {
```

```
        fclose( fBitFile );
        }
int CBitInput :: InputBit (void)
        {
        // input single bit
        }
unsigned long CBitInput :: InputBit (int iBitCount)
        {
        // to return multiple bits specified by iBitCount
        }

/************************* End of CBITIO.C *************************/
```

APPENDIX B

```
** MSG: Starts Experimental AMSAC Compression Session
** Source: uncoded.inp; Coded: coded.out;
   Symbol_MAX: 256; Arithm_MAX:   5

** MSG: The time is Mon Nov 13 16:18:25 1995

** MSG: Root is node 0;weight:    3
** MSG:    1 Internal Node; parent:   0; Child :   3,weight     2
** MSG:    2 node, is Leaf; parent:   0; Symbol: 256,weight     1
** MSG:    3 node, is Leaf; parent:   1; Symbol: 257,weight     1
** MSG:    4 node, is Leaf; parent:   1; Symbol:  47,weight     1
** MSG: ____Starts Huffman Group
** MSG: AGroup:   4; NodeLimit:   9; NextFreeNode:   5;
** MSG: ____HGroup is NULL; All nodes are in A-Group
** MSG:    Arithm_Symbol    0 is: 256
** MSG:    Arithm_Symbol    1 is: 257
** MSG:    Last Arithm_Symbol is a H-GROUP at location:  47
** MSG:

** MSG: Root is node 0;weight:    4
** MSG:    1 Internal Node; parent:   0; Child :   3,weight     2
** MSG:    2 Internal Node; parent:   0; Child :   5,weight     2
** MSG:    3 node, is Leaf; parent:   1; Symbol: 257,weight     1
** MSG:    4 node, is Leaf; parent:   1; Symbol: 256,weight     1
** MSG:    5 node, is Leaf; parent:   2; Symbol:  47,weight     1
** MSG:    6 node, is Leaf; parent:   2; Symbol:  42,weight     1
** MSG: ____Starts Huffman Group
** MSG: AGroup:   6; NodeLimit:   9; NextFreeNode:   7;
** MSG: ____HGroup is NULL; All nodes are in A-Group
** MSG:    Arithm_Symbol    0 is: 257
** MSG:    Arithm_Symbol    1 is: 256
** MSG:    Arithm_Symbol    2 is:  47
** MSG:    Last Arithm_Symbol is a H-GROUP at location:  42
** MSG:

** MSG: Root is node 0;weight:    5
** MSG:    1 Internal Node; parent:   0; Child :   3,weight     3
** MSG:    2 Internal Node; parent:   0; Child :   5,weight     2
** MSG:    3 node, is Leaf; parent:   1; Symbol:  42,weight     2
** MSG:    4 node, is Leaf; parent:   1; Symbol: 256,weight     1
** MSG:    5 node, is Leaf; parent:   2; Symbol:  47,weight     1
** MSG:    6 node, is Leaf; parent:   2; Symbol: 257,weight     1
```

```
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:  42
** MSG:     Arithm_Symbol    1 is:  256
** MSG:     Arithm_Symbol    2 is:  47
** MSG:     Last Arithm_Symbol is a H-GROUP at location: 257
** MSG:

** MSG: Root is node 0;weight:      6
** MSG:     1 Internal Node; parent:   0; Child :    3,weight        3
** MSG:     2 node, is Leaf; parent:   0; Symbol:   42,weight        3
** MSG:     3 Internal Node; parent:   1; Child :    5,weight        2
** MSG:     4 node, is Leaf; parent:   1; Symbol:  256,weight        1
** MSG:     5 node, is Leaf; parent:   3; Symbol:   47,weight        1
** MSG:     6 node, is Leaf; parent:   3; Symbol:  257,weight        1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:  42
** MSG:     Arithm_Symbol    1 is:  256
** MSG:     Arithm_Symbol    2 is:  47
** MSG:     Last Arithm_Symbol is a H-GROUP at location: 257
** MSG:

** MSG: Root is node 0;weight:      7
** MSG:     1 node, is Leaf; parent:   0; Symbol:   42,weight        4
** MSG:     2 Internal Node; parent:   0; Child :    3,weight        3
** MSG:     3 Internal Node; parent:   2; Child :    5,weight        2
** MSG:     4 node, is Leaf; parent:   2; Symbol:  256,weight        1
** MSG:     5 node, is Leaf; parent:   3; Symbol:   47,weight        1
** MSG:     6 node, is Leaf; parent:   3; Symbol:  257,weight        1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:  42
** MSG:     Arithm_Symbol    1 is:  256
** MSG:     Arithm_Symbol    2 is:  47
** MSG:     Last Arithm_Symbol is a H-GROUP at location: 257
** MSG:

** MSG: Root is node 0;weight:      8
** MSG:     1 node, is Leaf; parent:   0; Symbol:   42,weight        5
** MSG:     2 Internal Node; parent:   0; Child :    3,weight        3
```

```
** MSG:    3 Internal Node; parent:   2; Child :   5,weight      2
** MSG:    4 node, is Leaf; parent:   2; Symbol:  256,weight      1
** MSG:    5 node, is Leaf; parent:   3; Symbol:   47,weight      1
** MSG:    6 node, is Leaf; parent:   3; Symbol:  257,weight      1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:   42
** MSG:     Arithm_Symbol    1 is:  256
** MSG:     Arithm_Symbol    2 is:   47
** MSG:     Last Arithm_Symbol is a H-GROUP at location:  257
** MSG:

** MSG: Root is node 0;weight:    9
** MSG:    1 node, is Leaf; parent:   0; Symbol:   42,weight      6
** MSG:    2 Internal Node; parent:   0; Child :   3,weight      3
** MSG:    3 Internal Node; parent:   2; Child :   5,weight      2
** MSG:    4 node, is Leaf; parent:   2; Symbol:  256,weight      1
** MSG:    5 node, is Leaf; parent:   3; Symbol:   47,weight      1
** MSG:    6 node, is Leaf; parent:   3; Symbol:  257,weight      1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:   42
** MSG:     Arithm_Symbol    1 is:  256
** MSG:     Arithm_Symbol    2 is:   47
** MSG:     Last Arithm_Symbol is a H-GROUP at location:  257
** MSG:

** MSG: Root is node 0;weight:   10
** MSG:    1 node, is Leaf; parent:   0; Symbol:   42,weight      7
** MSG:    2 Internal Node; parent:   0; Child :   3,weight      3
** MSG:    3 Internal Node; parent:   2; Child :   5,weight      2
** MSG:    4 node, is Leaf; parent:   2; Symbol:  256,weight      1
** MSG:    5 node, is Leaf; parent:   3; Symbol:   47,weight      1
** MSG:    6 node, is Leaf; parent:   3; Symbol:  257,weight      1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:   42
** MSG:     Arithm_Symbol    1 is:  256
** MSG:     Arithm_Symbol    2 is:   47
** MSG:     Last Arithm_Symbol is a H-GROUP at location:  257
** MSG:
```

```
** MSG: Root is node 0;weight:    11
** MSG:    1 node, is Leaf; parent:    0; Symbol:    42,weight     8
** MSG:    2 Internal Node; parent:   0; Child :   3,weight     3
** MSG:    3 Internal Node; parent:   2; Child :   5,weight     2
** MSG:    4 node, is Leaf; parent:    2; Symbol:    256,weight    1
** MSG:    5 node, is Leaf; parent:    3; Symbol:    47,weight     1
** MSG:    6 node, is Leaf; parent:    3; Symbol:    257,weight    1
** MSG: ____Starts Huffman Group
** MSG: AGroup:   6; NodeLimit:    9; NextFreeNode:   7;
** MSG: ____HGroup is NULL; All nodes are in A-Group
** MSG:    Arithm_Symbol    0 is:   42
** MSG:    Arithm_Symbol    1 is:   256
** MSG:    Arithm_Symbol    2 is:   47
** MSG:    Last Arithm_Symbol is a H-GROUP at location:  257
** MSG:

** MSG: Root is node 0;weight:    12
** MSG:    1 node, is Leaf; parent:    0; Symbol:    42,weight     9
** MSG:    2 Internal Node; parent:   0; Child :   3,weight     3
** MSG:    3 Internal Node; parent:   2; Child :   5,weight     2
** MSG:    4 node, is Leaf; parent:    2; Symbol:    256,weight    1
** MSG:    5 node, is Leaf; parent:    3; Symbol:    47,weight     1
** MSG:    6 node, is Leaf; parent:    3; Symbol:    257,weight    1
** MSG: ____Starts Huffman Group
** MSG: AGroup:   6; NodeLimit:    9; NextFreeNode:   7;
** MSG: ____HGroup is NULL; All nodes are in A-Group
** MSG:    Arithm_Symbol    0 is:   42
** MSG:    Arithm_Symbol    1 is:   256
** MSG:    Arithm_Symbol    2 is:   47
** MSG:    Last Arithm_Symbol is a H-GROUP at location:  257
** MSG:

** MSG: Root is node 0;weight:    13
** MSG:    1 node, is Leaf; parent:    0; Symbol:    42,weight     10
** MSG:    2 Internal Node; parent:   0; Child :   3,weight     3
** MSG:    3 Internal Node; parent:   2; Child :   5,weight     2
** MSG:    4 node, is Leaf; parent:    2; Symbol:    256,weight    1
** MSG:    5 node, is Leaf; parent:    3; Symbol:    47,weight     1
** MSG:    6 node, is Leaf; parent:    3; Symbol:    257,weight    1
** MSG: ____Starts Huffman Group
** MSG: AGroup:   6; NodeLimit:    9; NextFreeNode:   7;
** MSG: ____HGroup is NULL; All nodes are in A-Group
** MSG:    Arithm_Symbol    0 is:   42
** MSG:    Arithm_Symbol    1 is:   256
```

```
** MSG:      Arithm_Symbol   2 is:   47
** MSG:      Last Arithm_Symbol is a H-GROUP at location: 257
** MSG:

** MSG: Root is node 0;weight:    14
** MSG:      1 node, is Leaf; parent:   0; Symbol:   42,weight     11
** MSG:      2 Internal Node; parent:  0; Child :   3,weight       3
** MSG:      3 Internal Node; parent:  2; Child :   5,weight       2
** MSG:      4 node, is Leaf; parent:   2; Symbol:   256,weight    1
** MSG:      5 node, is Leaf; parent:   3; Symbol:   47,weight     1
** MSG:      6 node, is Leaf; parent:   3; Symbol:   257,weight    1
** MSG: ____Starts Huffman Group
** MSG: AGroup:   6; NodeLimit:   9; NextFreeNode:   7;
** MSG: ____HGroup is NULL; All nodes are in A-Group
** MSG:      Arithm_Symbol   0 is:   42
** MSG:      Arithm_Symbol   1 is:   256
** MSG:      Arithm_Symbol   2 is:   47
** MSG:      Last Arithm_Symbol is a H-GROUP at location: 257
** MSG:

** MSG: Root is node 0;weight:    15
** MSG:      1 node, is Leaf; parent:   0; Symbol:   42,weight     12
** MSG:      2 Internal Node; parent:  0; Child :   3,weight       3
** MSG:      3 Internal Node; parent:  2; Child :   5,weight       2
** MSG:      4 node, is Leaf; parent:   2; Symbol:   256,weight    1
** MSG:      5 node, is Leaf; parent:   3; Symbol:   47,weight     1
** MSG:      6 node, is Leaf; parent:   3; Symbol:   257,weight    1
** MSG: ____Starts Huffman Group
** MSG: AGroup:   6; NodeLimit:   9; NextFreeNode:   7;
** MSG: ____HGroup is NULL; All nodes are in A-Group
** MSG:      Arithm_Symbol   0 is:   42
** MSG:      Arithm_Symbol   1 is:   256
** MSG:      Arithm_Symbol   2 is:   47
** MSG:      Last Arithm_Symbol is a H-GROUP at location: 257
** MSG:

** MSG: Root is node 0;weight:    16
** MSG:      1 node, is Leaf; parent:   0; Symbol:   42,weight     13
** MSG:      2 Internal Node; parent:  0; Child :   3,weight       3
** MSG:      3 Internal Node; parent:  2; Child :   5,weight       2
** MSG:      4 node, is Leaf; parent:   2; Symbol:   256,weight    1
** MSG:      5 node, is Leaf; parent:   3; Symbol:   47,weight     1
** MSG:      6 node, is Leaf; parent:   3; Symbol:   257,weight    1
** MSG: ____Starts Huffman Group
```

```
** MSG: AGroup:   6; NodeLimit:   9; NextFreeNode:   7;
** MSG: ____HGroup is NULL; All nodes are in A-Group
** MSG:    Arithm_Symbol    0 is:   42
** MSG:    Arithm_Symbol    1 is:  256
** MSG:    Arithm_Symbol    2 is:   47
** MSG:    Last Arithm_Symbol is a H-GROUP at location:  257
** MSG:

** MSG: Root is node 0;weight:    17
** MSG:    1 node, is Leaf; parent:    0; Symbol:    42,weight      14
** MSG:    2 Internal Node; parent:   0; Child :    3,weight       3
** MSG:    3 Internal Node; parent:   2; Child :    5,weight       2
** MSG:    4 node, is Leaf; parent:    2; Symbol:   256,weight       1
** MSG:    5 node, is Leaf; parent:    3; Symbol:    47,weight       1
** MSG:    6 node, is Leaf; parent:    3; Symbol:   257,weight       1
** MSG: ____Starts Huffman Group
** MSG: AGroup:   6; NodeLimit:   9; NextFreeNode:   7;
** MSG: ____HGroup is NULL; All nodes are in A-Group
** MSG:    Arithm_Symbol    0 is:   42
** MSG:    Arithm_Symbol    1 is:  256
** MSG:    Arithm_Symbol    2 is:   47
** MSG:    Last Arithm_Symbol is a H-GROUP at location:  257
** MSG:

** MSG: Root is node 0;weight:    18
** MSG:    1 node, is Leaf; parent:    0; Symbol:    42,weight      15
** MSG:    2 Internal Node; parent:   0; Child :    3,weight       3
** MSG:    3 Internal Node; parent:   2; Child :    5,weight       2
** MSG:    4 node, is Leaf; parent:    2; Symbol:   256,weight       1
** MSG:    5 node, is Leaf; parent:    3; Symbol:    47,weight       1
** MSG:    6 node, is Leaf; parent:    3; Symbol:   257,weight       1
** MSG: ____Starts Huffman Group
** MSG: AGroup:   6; NodeLimit:   9; NextFreeNode:   7;
** MSG: ____HGroup is NULL; All nodes are in A-Group
** MSG:    Arithm_Symbol    0 is:   42
** MSG:    Arithm_Symbol    1 is:  256
** MSG:    Arithm_Symbol    2 is:   47
** MSG:    Last Arithm_Symbol is a H-GROUP at location:  257
** MSG:

** MSG: Root is node 0;weight:    19
** MSG:    1 node, is Leaf; parent:    0; Symbol:    42,weight      16
** MSG:    2 Internal Node; parent:   0; Child :    3,weight       3
** MSG:    3 Internal Node; parent:   2; Child :    5,weight       2
```

```
** MSG:    4 node, is Leaf; parent:    2; Symbol:   256,weight      1
** MSG:    5 node, is Leaf; parent:    3; Symbol:    47,weight      1
** MSG:    6 node, is Leaf; parent:    3; Symbol:   257,weight      1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:   42
** MSG:     Arithm_Symbol    1 is:  256
** MSG:     Arithm_Symbol    2 is:   47
** MSG:     Last Arithm_Symbol is a H-GROUP at location:  257
** MSG:

** MSG: Root is node 0;weight:    20
** MSG:    1 node, is Leaf; parent:    0; Symbol:    42,weight     17
** MSG:    2 Internal Node; parent:    0; Child :    3,weight      3
** MSG:    3 Internal Node; parent:    2; Child :    5,weight      2
** MSG:    4 node, is Leaf; parent:    2; Symbol:   256,weight      1
** MSG:    5 node, is Leaf; parent:    3; Symbol:    47,weight      1
** MSG:    6 node, is Leaf; parent:    3; Symbol:   257,weight      1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:   42
** MSG:     Arithm_Symbol    1 is:  256
** MSG:     Arithm_Symbol    2 is:   47
** MSG:     Last Arithm_Symbol is a H-GROUP at location:  257
** MSG:

** MSG: Root is node 0;weight:    21
** MSG:    1 node, is Leaf; parent:    0; Symbol:    42,weight     18
** MSG:    2 Internal Node; parent:    0; Child :    3,weight      3
** MSG:    3 Internal Node; parent:    2; Child :    5,weight      2
** MSG:    4 node, is Leaf; parent:    2; Symbol:   256,weight      1
** MSG:    5 node, is Leaf; parent:    3; Symbol:    47,weight      1
** MSG:    6 node, is Leaf; parent:    3; Symbol:   257,weight      1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol    0 is:   42
** MSG:     Arithm_Symbol    1 is:  256
** MSG:     Arithm_Symbol    2 is:   47
** MSG:     Last Arithm_Symbol is a H-GROUP at location:  257
** MSG:
```

```
** MSG: Root is node 0;weight:    22
** MSG:    1 node, is Leaf; parent:    0; Symbol:    42,weight    19
** MSG:    2 Internal Node; parent:    0; Child :    3,weight    3
** MSG:    3 Internal Node; parent:    2; Child :    5,weight    2
** MSG:    4 node, is Leaf; parent:    2; Symbol:    256,weight    1
** MSG:    5 node, is Leaf; parent:    3; Symbol:    47,weight    1
** MSG:    6 node, is Leaf; parent:    3; Symbol:    257,weight    1
** MSG: ____Starts Huffman Group
** MSG: AGroup:    6; NodeLimit:    9; NextFreeNode:    7;
** MSG: ____HGroup is NULL; All nodes are in A-Group
** MSG:    Arithm_Symbol    0 is:    42
** MSG:    Arithm_Symbol    1 is:    256
** MSG:    Arithm_Symbol    2 is:    47
** MSG:    Last Arithm_Symbol is a H-GROUP at location:    257
** MSG:

** MSG: Root is node 0;weight:    23
** MSG:    1 node, is Leaf; parent:    0; Symbol:    42,weight    20
** MSG:    2 Internal Node; parent:    0; Child :    3,weight    3
** MSG:    3 Internal Node; parent:    2; Child :    5,weight    2
** MSG:    4 node, is Leaf; parent:    2; Symbol:    256,weight    1
** MSG:    5 node, is Leaf; parent:    3; Symbol:    47,weight    1
** MSG:    6 node, is Leaf; parent:    3; Symbol:    257,weight    1
** MSG: ____Starts Huffman Group
** MSG: AGroup:    6; NodeLimit:    9; NextFreeNode:    7;
** MSG: ____HGroup is NULL; All nodes are in A-Group
** MSG:    Arithm_Symbol    0 is:    42
** MSG:    Arithm_Symbol    1 is:    256
** MSG:    Arithm_Symbol    2 is:    47
** MSG:    Last Arithm_Symbol is a H-GROUP at location:    257
** MSG:

** MSG: Root is node 0;weight:    24
** MSG:    1 node, is Leaf; parent:    0; Symbol:    42,weight    21
** MSG:    2 Internal Node; parent:    0; Child :    3,weight    3
** MSG:    3 Internal Node; parent:    2; Child :    5,weight    2
** MSG:    4 node, is Leaf; parent:    2; Symbol:    256,weight    1
** MSG:    5 node, is Leaf; parent:    3; Symbol:    47,weight    1
** MSG:    6 node, is Leaf; parent:    3; Symbol:    257,weight    1
** MSG: ____Starts Huffman Group
** MSG: AGroup:    6; NodeLimit:    9; NextFreeNode:    7;
** MSG: ____HGroup is NULL; All nodes are in A-Group
** MSG:    Arithm_Symbol    0 is:    42
** MSG:    Arithm_Symbol    1 is:    256
```

```
** MSG:      Arithm_Symbol   2 is:  47
** MSG:      Last Arithm_Symbol is a H-GROUP at location:  257
** MSG:

** MSG: Root is node 0;weight:    25
** MSG:    1 node, is Leaf; parent:   0; Symbol:    42,weight    22
** MSG:    2 Internal Node; parent: 0; Child :    3,weight     3
** MSG:    3 Internal Node; parent: 2; Child :    5,weight     2
** MSG:    4 node, is Leaf; parent:   2; Symbol:   256,weight     1
** MSG:    5 node, is Leaf; parent:   3; Symbol:    47,weight     1
** MSG:    6 node, is Leaf; parent:   3; Symbol:   257,weight     1
** MSG: ____Starts Huffman Group
** MSG: AGroup:   6; NodeLimit:   9; NextFreeNode:   7;
** MSG: ____HGroup is NULL; All nodes are in A-Group
** MSG:      Arithm_Symbol   0 is:  42
** MSG:      Arithm_Symbol   1 is: 256
** MSG:      Arithm_Symbol   2 is:  47
** MSG:      Last Arithm_Symbol is a H-GROUP at location:  257
** MSG:

** MSG: Root is node 0;weight:    26
** MSG:    1 node, is Leaf; parent:   0; Symbol:    42,weight    23
** MSG:    2 Internal Node; parent: 0; Child :    3,weight     3
** MSG:    3 Internal Node; parent: 2; Child :    5,weight     2
** MSG:    4 node, is Leaf; parent:   2; Symbol:   256,weight     1
** MSG:    5 node, is Leaf; parent:   3; Symbol:    47,weight     1
** MSG:    6 node, is Leaf; parent:   3; Symbol:   257,weight     1
** MSG: ____Starts Huffman Group
** MSG: AGroup:   6; NodeLimit:   9; NextFreeNode:   7;
** MSG: ____HGroup is NULL; All nodes are in A-Group
** MSG:      Arithm_Symbol   0 is:  42
** MSG:      Arithm_Symbol   1 is: 256
** MSG:      Arithm_Symbol   2 is:  47
** MSG:      Last Arithm_Symbol is a H-GROUP at location:  257
** MSG:

** MSG: Root is node 0;weight:    27
** MSG:    1 node, is Leaf; parent:   0; Symbol:    42,weight    24
** MSG:    2 Internal Node; parent: 0; Child :    3,weight     3
** MSG:    3 Internal Node; parent: 2; Child :    5,weight     2
** MSG:    4 node, is Leaf; parent:   2; Symbol:   256,weight     1
** MSG:    5 node, is Leaf; parent:   3; Symbol:    47,weight     1
** MSG:    6 node, is Leaf; parent:   3; Symbol:   257,weight     1
** MSG: ____Starts Huffman Group
```

```
** MSG: AGroup:   6; NodeLimit:   9; NextFreeNode:   7;
** MSG: ____HGroup is NULL; All nodes are in A-Group
** MSG:     Arithm_Symbol   0 is:  42
** MSG:     Arithm_Symbol   1 is:  256
** MSG:     Arithm_Symbol   2 is:  47
** MSG:     Last Arithm_Symbol is a H-GROUP at location: 257
** MSG:

** MSG: Root is node 0;weight:    28
** MSG:   1 node, is Leaf; parent:     0; Symbol:    42,weight      25
** MSG:   2 Internal Node; parent:    0; Child :    3,weight       3
** MSG:   3 Internal Node; parent:    2; Child :    5,weight       2
** MSG:   4 node, is Leaf; parent:     2; Symbol:   256,weight       1
** MSG:   5 node, is Leaf; parent:     3; Symbol:    47,weight       1
** MSG:   6 node, is Leaf; parent:     3; Symbol:   257,weight       1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol   0 is:  42
** MSG:     Arithm_Symbol   1 is:  256
** MSG:     Arithm_Symbol   2 is:  47
** MSG:     Last Arithm_Symbol is a H-GROUP at location: 257
** MSG:

** MSG: Root is node 0;weight:    29
** MSG:   1 node, is Leaf; parent:     0; Symbol:    42,weight      26
** MSG:   2 Internal Node; parent:    0; Child :    3,weight       3
** MSG:   3 Internal Node; parent:    2; Child :    5,weight       2
** MSG:   4 node, is Leaf; parent:     2; Symbol:   256,weight       1
** MSG:   5 node, is Leaf; parent:     3; Symbol:    47,weight       1
** MSG:   6 node, is Leaf; parent:     3; Symbol:   257,weight       1
** MSG: ____Starts Huffman Group
** MSG: AGroup:   6; NodeLimit:   9; NextFreeNode:   7;
** MSG: ____HGroup is NULL; All nodes are in A-Group
** MSG:     Arithm_Symbol   0 is:  42
** MSG:     Arithm_Symbol   1 is:  256
** MSG:     Arithm_Symbol   2 is:  47
** MSG:     Last Arithm_Symbol is a H-GROUP at location: 257
** MSG:

** MSG: Root is node 0;weight:    30
** MSG:   1 node, is Leaf; parent:     0; Symbol:    42,weight      26
** MSG:   2 Internal Node; parent:    0; Child :    3,weight       4
** MSG:   3 Internal Node; parent:    2; Child :    5,weight       2
```

```
** MSG:    4 Internal Node; parent:    2; Child :    7,weight      2
** MSG:    5 node, is Leaf; parent:    3; Symbol:   47,weight      1
** MSG:    6 node, is Leaf; parent:    3; Symbol:  256,weight      1
** MSG:    7 node, is Leaf; parent:    4; Symbol:  257,weight      1
** MSG:    8 node, is Leaf; parent:    4; Symbol:   32,weight      1
** MSG: ____Starts Huffman Group
** MSG: AGroup:    8; NodeLimit:    9; NextFreeNode:    9;
** MSG: ____HGroup is NULL; All nodes are in A-Group
** MSG:    Arithm_Symbol    0 is:   42
** MSG:    Arithm_Symbol    1 is:   47
** MSG:    Arithm_Symbol    2 is:   256
** MSG:    Arithm_Symbol    3 is:   257
** MSG:    Last Arithm_Symbol is a H-GROUP at location:    32
** MSG:

** MSG: Root is node 0;weight:    31
** MSG:    1 node, is Leaf; parent:    0; Symbol:   42,weight     26
** MSG:    2 Internal Node; parent:    0; Child :    3,weight      5
** MSG:    3 Internal Node; parent:    2; Child :    5,weight      3
** MSG:    4 Internal Node; parent:    2; Child :    7,weight      2
** MSG:    5 Internal Node; parent:    3; Child :    9,weight      2
** MSG:    6 node, is Leaf; parent:    3; Symbol:  256,weight      1
** MSG:    7 node, is Leaf; parent:    4; Symbol:  257,weight      1
** MSG:    8 node, is Leaf; parent:    4; Symbol:   47,weight      1
** MSG: ____Starts Huffman Group
** MSG:    9 node, is Leaf; parent:    5; Symbol:   32,weight      1
** MSG:   10 node, is Leaf; parent:    5; Symbol:   83,weight      1
** MSG: AGroup:    8; NodeLimit:    9; NextFreeNode:   11;
** MSG: SingleSubTreeNode:    5 ;CutPointOutDegree is:    2, OutDegree is:    2
** MSG: ____1st node after the cutline in HuffmanGroup..
** MSG:    9 node, is Leaf; parent:    5; Symbol:   32,  weight     1
** MSG:    Arithm_Symbol    0 is:   42
** MSG:    Arithm_Symbol    1 is:   256
** MSG:    Arithm_Symbol    2 is:   257
** MSG:    Arithm_Symbol    3 is:   47
** MSG:    Last Arithm_Symbol is a H-GROUP at location:    5
** MSG:

** MSG: Root is node 0;weight:    32
** MSG:    1 node, is Leaf; parent:    0; Symbol:   42,weight     26
** MSG:    2 Internal Node; parent:    0; Child :    3,weight      6
** MSG: ____Starts Huffman Group
** MSG:    3 Internal Node; parent:    2; Child :    5,weight      4
** MSG:    4 Internal Node; parent:    2; Child :    7,weight      2
```

```
** MSG:    5 Internal Node; parent:   3; Child :   9,weight     2
** MSG:    6 Internal Node; parent:   3; Child :  11,weight     2
** MSG:    7 node, is Leaf; parent:   4; Symbol:  257,weight    1
** MSG:    8 node, is Leaf; parent:   4; Symbol:   47,weight    1
** MSG:    9 node, is Leaf; parent:   5; Symbol:   32,weight    1
** MSG:   10 node, is Leaf; parent:   5; Symbol:  256,weight    1
** MSG:   11 node, is Leaf; parent:   6; Symbol:   83,weight    1
** MSG:   12 node, is Leaf; parent:   6; Symbol:  116,weight    1
** MSG: AGroup:   2; NodeLimit:   9; NextFreeNode: 13;
** MSG: SingleSubTreeNode:   2 ;CutPointOutDegree is:   2, OutDegree is:   4
** MSG: ____1st node after the cutline in HuffmanGroup..
** MSG:    3 Internal Node; parent:   2; Child :   5,   weight     4
** MSG:      Arithm_Symbol   0 is:  42
** MSG:      Arithm_Symbol   1 is: 257
** MSG:      Arithm_Symbol   2 is:  47
** MSG:      Last Arithm_Symbol is a H-GROUP at location:   2
** MSG:

** MSG: Root is node 0;weight:   33
** MSG:    1 node, is Leaf; parent:   0; Symbol:   42,weight    26
** MSG:    2 Internal Node; parent:   0; Child :   3,weight     7
** MSG: ____Starts Huffman Group
** MSG:    3 Internal Node; parent:   2; Child :   5,weight     4
** MSG:    4 Internal Node; parent:   2; Child :   7,weight     3
** MSG:    5 Internal Node; parent:   3; Child :   9,weight     2
** MSG:    6 Internal Node; parent:   3; Child :  11,weight     2
** MSG:    7 Internal Node; parent:   4; Child :  13,weight     2
** MSG:    8 node, is Leaf; parent:   4; Symbol:   47,weight    1
** MSG:    9 node, is Leaf; parent:   5; Symbol:   32,weight    1
** MSG:   10 node, is Leaf; parent:   5; Symbol:  256,weight    1
** MSG:   11 node, is Leaf; parent:   6; Symbol:   83,weight    1
** MSG:   12 node, is Leaf; parent:   6; Symbol:  257,weight    1
** MSG: AGroup:   2; NodeLimit:   9; NextFreeNode: 15;
** MSG: SingleSubTreeNode:   2 ;CutPointOutDegree is:   2, OutDegree is:   6
** MSG: ____1st node after the cutline in HuffmanGroup..
** MSG:    3 Internal Node; parent:   2; Child :   5,   weight     4
** MSG:      Arithm_Symbol   0 is:  42
** MSG:      Arithm_Symbol   1 is:  47
** MSG:      Last Arithm_Symbol is a H-GROUP at location:   2
** MSG:

** MSG: Root is node 0;weight:   34
** MSG:    1 node, is Leaf; parent:   0; Symbol:   42,weight    26
** MSG:    2 Internal Node; parent:   0; Child :   3,weight     8
```

```
** MSG:      Starts Huffman Group
** MSG:  3 Internal Node; parent:  2; Child :  5,weight      4
** MSG:  4 Internal Node; parent:  2; Child :  7,weight      4
** MSG:  5 Internal Node; parent:  3; Child :  9,weight      2
** MSG:  6 Internal Node; parent:  3; Child :  11,weight     2
** MSG:  7 Internal Node; parent:  4; Child :  13,weight     2
** MSG:  8 Internal Node; parent:  4; Child :  15,weight     2
** MSG:  9 node, is Leaf; parent:  5; Symbol:  32,weight     1
** MSG:  10 node, is Leaf; parent: 5; Symbol:  256,weight    1
** MSG:  11 node, is Leaf; parent: 6; Symbol:  83,weight     1
** MSG:  12 node, is Leaf; parent: 6; Symbol:  257,weight    1
** MSG: AGroup:  2; NodeLimit:  9; NextFreeNode: 17;
** MSG: SingleSubTreeNode:  2 ;CutPointOutDegree is:  2, OutDegree is:  8
** MSG:      1st node after the cutline in HuffmanGroup..
** MSG:  3 Internal Node; parent:  2; Child :  5,    weight    4
** MSG:     Arithm_Symbol   0 is:  42
** MSG:     Last Arithm_Symbol is a H-GROUP at location:   2
** MSG:

** MSG: Root is node 0;weight:    35
** MSG:  1 node, is Leaf; parent:  0; Symbol:  42,weight     26
** MSG:  2 Internal Node; parent:  0; Child :  3,weight      9
** MSG:      Starts Huffman Group
** MSG:  3 Internal Node; parent:  2; Child :  5,weight      5
** MSG:  4 Internal Node; parent:  2; Child :  7,weight      4
** MSG:  5 Internal Node; parent:  3; Child :  9,weight      3
** MSG:  6 Internal Node; parent:  3; Child :  11,weight     2
** MSG:  7 Internal Node; parent:  4; Child :  13,weight     2
** MSG:  8 Internal Node; parent:  4; Child :  15,weight     2
** MSG:  9 node, is Leaf; parent:  5; Symbol:  116,weight    2
** MSG:  10 node, is Leaf; parent: 5; Symbol:  256,weight    1
** MSG:  11 node, is Leaf; parent: 6; Symbol:  83,weight     1
** MSG:  12 node, is Leaf; parent: 6; Symbol:  257,weight    1
** MSG: AGroup:  2; NodeLimit:  9; NextFreeNode: 17;
** MSG: SingleSubTreeNode:  2 ;CutPointOutDegree is:  2, OutDegree is:  8
** MSG:      1st node after the cutline in HuffmanGroup..
** MSG:  3 Internal Node; parent:  2; Child :  5,    weight    5
** MSG:     Arithm_Symbol   0 is:  42
** MSG:     Last Arithm_Symbol is a H-GROUP at location:   2
** MSG:

** MSG: Root is node 0;weight:    36
** MSG:  1 node, is Leaf; parent:  0; Symbol:  42,weight     26
** MSG:  2 Internal Node; parent:  0; Child :  3,weight      10
```

```
** MSG: ____Starts Huffman Group
** MSG:    3 Internal Node; parent:   2; Child :   5,weight      6
** MSG:    4 Internal Node; parent:   2; Child :   7,weight      4
** MSG:    5 Internal Node; parent:   3; Child :   9,weight      4
** MSG:    6 Internal Node; parent:   3; Child :  11,weight      2
** MSG:    7 Internal Node; parent:   4; Child :  13,weight      2
** MSG:    8 Internal Node; parent:   4; Child :  15,weight      2
** MSG:    9 node, is Leaf; parent:   5; Symbol: 116,weight      2
** MSG:   10 node, is Leaf; parent:   5; Symbol:  32,weight      2
** MSG:   11 node, is Leaf; parent:   6; Symbol:  83,weight      1
** MSG:   12 node, is Leaf; parent:   6; Symbol: 257,weight      1
** MSG: AGroup:   2; NodeLimit:   9; NextFreeNode:  17;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,    weight    6
** MSG:    Arithm_Symbol    0 is:   42
** MSG:    Last Arithm_Symbol is a H-GROUP at location:   2
** MSG:

** MSG: Root is node 0;weight:   37
** MSG:    1 node, is Leaf; parent:   0; Symbol:  42,weight     26
** MSG:    2 Internal Node; parent:   0; Child :   3,weight     11
** MSG: ____Starts Huffman Group
** MSG:    3 Internal Node; parent:   2; Child :   5,weight      7
** MSG:    4 Internal Node; parent:   2; Child :   7,weight      4
** MSG:    5 Internal Node; parent:   3; Child :   9,weight      4
** MSG:    6 Internal Node; parent:   3; Child :  11,weight      3
** MSG:    7 Internal Node; parent:   4; Child :  13,weight      2
** MSG:    8 Internal Node; parent:   4; Child :  15,weight      2
** MSG:    9 node, is Leaf; parent:   5; Symbol: 116,weight      2
** MSG:   10 node, is Leaf; parent:   5; Symbol:  32,weight      2
** MSG:   11 Internal Node; parent:   6; Child :  17,weight      2
** MSG:   12 node, is Leaf; parent:   6; Symbol: 257,weight      1
** MSG: AGroup:   2; NodeLimit:   9; NextFreeNode:  19;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,    weight    7
** MSG:    Arithm_Symbol    0 is:   42
** MSG:    Last Arithm_Symbol is a H-GROUP at location:   2
** MSG:

** MSG: Root is node 0;weight:   38
** MSG:    1 node, is Leaf; parent:   0; Symbol:  42,weight     26
** MSG:    2 Internal Node; parent:   0; Child :   3,weight     12
```

```
** MSG: ____Starts Huffman Group
** MSG:    3 Internal Node; parent:    2; Child :   5,weight      8
** MSG:    4 Internal Node; parent:    2; Child :   7,weight      4
** MSG:    5 Internal Node; parent:    3; Child :   9,weight      4
** MSG:    6 Internal Node; parent:    3; Child :  11,weight      4
** MSG:    7 Internal Node; parent:    4; Child :  13,weight      2
** MSG:    8 Internal Node; parent:    4; Child :  15,weight      2
** MSG:    9 node, is Leaf; parent:    5; Symbol:  116,weight     2
** MSG:   10 node, is Leaf; parent:    5; Symbol:   32,weight     2
** MSG:   11 Internal Node; parent:    6; Child :  17,weight      2
** MSG:   12 Internal Node; parent:    6; Child :  19,weight      2
** MSG: AGroup:   2; NodeLimit:   9; NextFreeNode: 21;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:    2; Child :   5,    weight     8
** MSG:    Arithm_Symbol    0 is:  42
** MSG:    Last Arithm_Symbol is a H-GROUP at location:   2
** MSG:

** MSG: Root is node 0;weight:    39
** MSG:    1 node, is Leaf; parent:    0; Symbol:   42,weight    26
** MSG:    2 Internal Node; parent:    0; Child :   3,weight     13
** MSG: ____Starts Huffman Group
** MSG:    3 Internal Node; parent:    2; Child :   5,weight      8
** MSG:    4 Internal Node; parent:    2; Child :   7,weight      5
** MSG:    5 Internal Node; parent:    3; Child :   9,weight      4
** MSG:    6 Internal Node; parent:    3; Child :  11,weight      4
** MSG:    7 node, is Leaf; parent:    4; Symbol:   32,weight     3
** MSG:    8 Internal Node; parent:    4; Child :  15,weight      2
** MSG:    9 node, is Leaf; parent:    5; Symbol:  116,weight     2
** MSG:   10 Internal Node; parent:    5; Child :  13,weight      2
** MSG:   11 Internal Node; parent:    6; Child :  17,weight      2
** MSG:   12 Internal Node; parent:    6; Child :  19,weight      2
** MSG: AGroup:   2; NodeLimit:   9; NextFreeNode: 21;
** MSG: SingleSubTreeNode:   2 ;CutPointOutDegree is:   2, OutDegree is:   6
** MSG: ____1st node after the cutline in HuffmanGroup..
** MSG:    3 Internal Node; parent:    2; Child :   5,    weight     8
** MSG:    Arithm_Symbol    0 is:  42
** MSG:    Arithm_Symbol    1 is:  32
** MSG:    Last Arithm_Symbol is a H-GROUP at location:   2
** MSG:

** MSG: Root is node 0;weight:    40
** MSG:    1 node, is Leaf; parent:    0; Symbol:   42,weight    26
```

```
** MSG:    2 Internal Node; parent:    0; Child :    3,weight      14
** MSG:    ____Starts Huffman Group
** MSG:    3 Internal Node; parent:    2; Child :    5,weight      8
** MSG:    4 Internal Node; parent:    2; Child :    7,weight      6
** MSG:    5 Internal Node; parent:    3; Child :    9,weight      4
** MSG:    6 Internal Node; parent:    3; Child :    11,weight     4
** MSG:    7 node, is Leaf; parent:    4; Symbol:   32,weight      3
** MSG:    8 Internal Node; parent:    4; Child :    13,weight     3
** MSG:    9 node, is Leaf; parent:    5; Symbol:   116,weight     2
** MSG:    10 Internal Node; parent:   5; Child :    15,weight     2
** MSG:    11 Internal Node; parent:   6; Child :    17,weight     2
** MSG:    12 Internal Node; parent:   6; Child :    19,weight     2
** MSG: AGroup:   2; NodeLimit:    9; NextFreeNode: 23;
** MSG: SingleSubTreeNode:    2 ;CutPointOutDegree is:    2, OutDegree is:    6
** MSG:    ____1st node after the cutline in HuffmanGroup..
** MSG:    3 Internal Node; parent:    2; Child :    5,     weight      8
** MSG:    Arithm_Symbol    0 is:   42
** MSG:    Arithm_Symbol    1 is:   32
** MSG:    Last Arithm_Symbol is a H-GROUP at location:    2
** MSG:

** MSG: Root is node 0;weight:    41
** MSG:    1 node, is Leaf; parent:    0; Symbol:   42,weight     26
** MSG:    2 Internal Node; parent:    0; Child :    3,weight     15
** MSG:    ____Starts Huffman Group
** MSG:    3 Internal Node; parent:    2; Child :    5,weight      8
** MSG:    4 Internal Node; parent:    2; Child :    7,weight      7
** MSG:    5 Internal Node; parent:    3; Child :    9,weight      4
** MSG:    6 Internal Node; parent:    3; Child :    11,weight     4
** MSG:    7 Internal Node; parent:    4; Child :    13,weight     4
** MSG:    8 node, is Leaf; parent:    4; Symbol:   32,weight      3
** MSG:    9 node, is Leaf; parent:    5; Symbol:   116,weight     2
** MSG:    10 Internal Node; parent:   5; Child :    15,weight     2
** MSG:    11 Internal Node; parent:   6; Child :    17,weight     2
** MSG:    12 Internal Node; parent:   6; Child :    19,weight     2
** MSG: AGroup:   2; NodeLimit:    9; NextFreeNode: 25;
** MSG: SingleSubTreeNode:    2 ;CutPointOutDegree is:    2, OutDegree is:    6
** MSG:    ____1st node after the cutline in HuffmanGroup..
** MSG:    3 Internal Node; parent:    2; Child :    5,     weight      8
** MSG:    Arithm_Symbol    0 is:   42
** MSG:    Arithm_Symbol    1 is:   32
** MSG:    Last Arithm_Symbol is a H-GROUP at location:    2
** MSG:
```

```
** MSG: Root is node 0;weight:    42
** MSG:    1 node, is Leaf; parent:    0; Symbol:   42,weight    26
** MSG:    2 Internal Node; parent:   0; Child :   3,weight    16
** MSG:    ____Starts Huffman Group
** MSG:    3 Internal Node; parent:   2; Child :   5,weight     9
** MSG:    4 Internal Node; parent:   2; Child :   7,weight     7
** MSG:    5 Internal Node; parent:   3; Child :   9,weight     5
** MSG:    6 Internal Node; parent:   3; Child :   11,weight    4
** MSG:    7 Internal Node; parent:   4; Child :   13,weight    4
** MSG:    8 node, is Leaf; parent:    4; Symbol:   32,weight    3
** MSG:    9 Internal Node; parent:   5; Child :   15,weight    3
** MSG:    10 node, is Leaf; parent:   5; Symbol:   116,weight   2
** MSG:    11 Internal Node; parent:  6; Child :   17,weight    2
** MSG:    12 Internal Node; parent:  6; Child :   19,weight    2
** MSG: AGroup:   2; NodeLimit:   9; NextFreeNode:   27;
** MSG: SingleSubTreeNode:   2 ;CutPointOutDegree is:   2, OutDegree is:   6
** MSG:    ____1st node after the cutline in HuffmanGroup..
** MSG:    3 Internal Node; parent:   2; Child :   5,    weight    9
** MSG:    Arithm_Symbol    0 is:   42
** MSG:    Arithm_Symbol    1 is:   32
** MSG:    Last Arithm_Symbol is a H-GROUP at location:    2
** MSG:

** MSG: Root is node 0;weight:    43
** MSG:    1 node, is Leaf; parent:    0; Symbol:   42,weight    26
** MSG:    2 Internal Node; parent:   0; Child :   3,weight    17
** MSG:    ____Starts Huffman Group
** MSG:    3 Internal Node; parent:   2; Child :   5,weight     9
** MSG:    4 Internal Node; parent:   2; Child :   7,weight     8
** MSG:    5 Internal Node; parent:   3; Child :   9,weight     5
** MSG:    6 Internal Node; parent:   3; Child :   11,weight    4
** MSG:    7 Internal Node; parent:   4; Child :   13,weight    4
** MSG:    8 Internal Node; parent:   4; Child :   15,weight    4
** MSG:    9 node, is Leaf; parent:    5; Symbol:   32,weight    3
** MSG:    10 node, is Leaf; parent:   5; Symbol:   116,weight   2
** MSG:    11 Internal Node; parent:  6; Child :   17,weight    2
** MSG:    12 Internal Node; parent:  6; Child :   19,weight    2
** MSG: AGroup:   2; NodeLimit:   9; NextFreeNode:   27;
** MSG: SingleSubTreeNode:   2 ;CutPointOutDegree is:   2, OutDegree is:   8
** MSG:    ____1st node after the cutline in HuffmanGroup..
** MSG:    3 Internal Node; parent:   2; Child :   5,    weight    9
** MSG:    Arithm_Symbol    0 is:   42
** MSG:    Last Arithm_Symbol is a H-GROUP at location:    2
** MSG:
```

```
** MSG: Root is node 0;weight:    44
** MSG:    1 node, is Leaf; parent:   0; Symbol:   42,weight     26
** MSG:    2 Internal Node; parent:  0; Child :   3,weight      18
** MSG: ____Starts Huffman Group
** MSG:    3 Internal Node; parent:  2; Child :   5,weight      10
** MSG:    4 Internal Node; parent:  2; Child :   7,weight       8
** MSG:    5 Internal Node; parent:  3; Child :   9,weight       6
** MSG:    6 Internal Node; parent:  3; Child :  11,weight       4
** MSG:    7 Internal Node; parent:  4; Child :  13,weight       4
** MSG:    8 Internal Node; parent:  4; Child :  15,weight       4
** MSG:    9 node, is Leaf; parent:   5; Symbol:   32,weight      3
** MSG:   10 Internal Node; parent:  5; Child :  17,weight       3
** MSG:   11 node, is Leaf; parent:   6; Symbol:  116,weight      2
** MSG:   12 Internal Node; parent:  6; Child :  19,weight       2
** MSG: AGroup:   2; NodeLimit:   9; NextFreeNode:  29;
** MSG: SingleSubTreeNode:   2 ;CutPointOutDegree is:  2, OutDegree is:   8
** MSG: ____1st node after the cutline in HuffmanGroup..
** MSG:    3 Internal Node; parent:  2; Child :   5,    weight     10
** MSG:     Arithm_Symbol    0 is:   42
** MSG:     Last Arithm_Symbol is a H-GROUP at location:    2
** MSG:

** MSG: Root is node 0;weight:    45
** MSG:    1 node, is Leaf; parent:   0; Symbol:   42,weight     26
** MSG:    2 Internal Node; parent:  0; Child :   3,weight      19
** MSG: ____Starts Huffman Group
** MSG:    3 Internal Node; parent:  2; Child :   5,weight      11
** MSG:    4 Internal Node; parent:  2; Child :   7,weight       8
** MSG:    5 Internal Node; parent:  3; Child :   9,weight       7
** MSG:    6 Internal Node; parent:  3; Child :  11,weight       4
** MSG:    7 Internal Node; parent:  4; Child :  13,weight       4
** MSG:    8 Internal Node; parent:  4; Child :  15,weight       4
** MSG:    9 Internal Node; parent:  5; Child :  17,weight       4
** MSG:   10 node, is Leaf; parent:   5; Symbol:   32,weight      3
** MSG:   11 node, is Leaf; parent:   6; Symbol:  116,weight      2
** MSG:   12 Internal Node; parent:  6; Child :  19,weight       2
** MSG: AGroup:   2; NodeLimit:   9; NextFreeNode:  31;
** MSG: SingleSubTreeNode:   2 ;CutPointOutDegree is:  2, OutDegree is:   8
** MSG: ____1st node after the cutline in HuffmanGroup..
** MSG:    3 Internal Node; parent:  2; Child :   5,    weight     11
** MSG:     Arithm_Symbol    0 is:   42
** MSG:     Last Arithm_Symbol is a H-GROUP at location:    2
** MSG:
```

```
** MSG: Root is node 0;weight:    46
** MSG:    1 node, is Leaf; parent:    0; Symbol:   42,weight    26
** MSG:    2 Internal Node; parent:   0; Child :   3,weight    20
** MSG: ____Starts Huffman Group
** MSG:    3 Internal Node; parent:   2; Child :   5,weight    12
** MSG:    4 Internal Node; parent:   2; Child :   7,weight     8
** MSG:    5 Internal Node; parent:   3; Child :   9,weight     7
** MSG:    6 Internal Node; parent:   3; Child :  11,weight     5
** MSG:    7 Internal Node; parent:   4; Child :  13,weight     4
** MSG:    8 Internal Node; parent:   4; Child :  15,weight     4
** MSG:    9 Internal Node; parent:   5; Child :  17,weight     4
** MSG:   10 node, is Leaf; parent:   5; Symbol:   32,weight     3
** MSG:   11 Internal Node; parent:   6; Child :  19,weight     3
** MSG:   12 node, is Leaf; parent:   6; Symbol:  116,weight     2
** MSG: AGroup:   2; NodeLimit:   9; NextFreeNode:  33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,   weight    12
** MSG:    Arithm_Symbol   0 is:   42
** MSG:    Last Arithm_Symbol is a H-GROUP at location:   2
** MSG:

** MSG: Root is node 0;weight:    47
** MSG:    1 node, is Leaf; parent:    0; Symbol:   42,weight    26
** MSG:    2 Internal Node; parent:   0; Child :   3,weight    21
** MSG: ____Starts Huffman Group
** MSG:    3 Internal Node; parent:   2; Child :   5,weight    13
** MSG:    4 Internal Node; parent:   2; Child :   7,weight     8
** MSG:    5 Internal Node; parent:   3; Child :   9,weight     8
** MSG:    6 Internal Node; parent:   3; Child :  11,weight     5
** MSG:    7 Internal Node; parent:   4; Child :  13,weight     4
** MSG:    8 Internal Node; parent:   4; Child :  15,weight     4
** MSG:    9 Internal Node; parent:   5; Child :  17,weight     4
** MSG:   10 node, is Leaf; parent:   5; Symbol:   32,weight     4
** MSG:   11 Internal Node; parent:   6; Child :  19,weight     3
** MSG:   12 node, is Leaf; parent:   6; Symbol:  116,weight     2
** MSG: AGroup:   2; NodeLimit:   9; NextFreeNode:  33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,   weight    13
** MSG:    Arithm_Symbol   0 is:   42
** MSG:    Last Arithm_Symbol is a H-GROUP at location:   2
** MSG:
```

```
** MSG: Root is node 0;weight:     48
** MSG:    1 node, is Leaf; parent:    0; Symbol:   42,weight    27
** MSG:    2 Internal Node; parent:   0; Child :   3,weight    21
** MSG: ____Starts Huffman Group
** MSG:    3 Internal Node; parent:   2; Child :   5,weight    13
** MSG:    4 Internal Node; parent:   2; Child :   7,weight     8
** MSG:    5 Internal Node; parent:   3; Child :   9,weight     8
** MSG:    6 Internal Node; parent:   3; Child :  11,weight     5
** MSG:    7 Internal Node; parent:   4; Child :  13,weight     4
** MSG:    8 Internal Node; parent:   4; Child :  15,weight     4
** MSG:    9 Internal Node; parent:   5; Child :  17,weight     4
** MSG:   10 node, is Leaf; parent:   5; Symbol:   32,weight     4
** MSG:   11 Internal Node; parent:   6; Child :  19,weight     3
** MSG:   12 node, is Leaf; parent:   6; Symbol:  116,weight     2
** MSG: AGroup:   2; NodeLimit:   9; NextFreeNode:  33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,    weight    13
** MSG:     Arithm_Symbol    0 is:   42
** MSG:     Last Arithm_Symbol is a H-GROUP at location:    2
** MSG:

** MSG: Root is node 0;weight:     49
** MSG:    1 node, is Leaf; parent:    0; Symbol:   42,weight    28
** MSG:    2 Internal Node; parent:   0; Child :   3,weight    21
** MSG: ____Starts Huffman Group
** MSG:    3 Internal Node; parent:   2; Child :   5,weight    13
** MSG:    4 Internal Node; parent:   2; Child :   7,weight     8
** MSG:    5 Internal Node; parent:   3; Child :   9,weight     8
** MSG:    6 Internal Node; parent:   3; Child :  11,weight     5
** MSG:    7 Internal Node; parent:   4; Child :  13,weight     4
** MSG:    8 Internal Node; parent:   4; Child :  15,weight     4
** MSG:    9 Internal Node; parent:   5; Child :  17,weight     4
** MSG:   10 node, is Leaf; parent:   5; Symbol:   32,weight     4
** MSG:   11 Internal Node; parent:   6; Child :  19,weight     3
** MSG:   12 node, is Leaf; parent:   6; Symbol:  116,weight     2
** MSG: AGroup:   2; NodeLimit:   9; NextFreeNode:  33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,    weight    13
** MSG:     Arithm_Symbol    0 is:   42
** MSG:     Last Arithm_Symbol is a H-GROUP at location:    2
** MSG:
```

```
** MSG: Root is node 0;weight:    50
** MSG:    1 node, is Leaf; parent:    0; Symbol:   42,weight    29
** MSG:    2 Internal Node; parent:   0; Child :   3,weight     21
** MSG: ____Starts Huffman Group
** MSG:    3 Internal Node; parent:   2; Child :   5,weight     13
** MSG:    4 Internal Node; parent:   2; Child :   7,weight      8
** MSG:    5 Internal Node; parent:   3; Child :   9,weight      8
** MSG:    6 Internal Node; parent:   3; Child :  11,weight      5
** MSG:    7 Internal Node; parent:   4; Child :  13,weight      4
** MSG:    8 Internal Node; parent:   4; Child :  15,weight      4
** MSG:    9 Internal Node; parent:   5; Child :  17,weight      4
** MSG:   10 node, is Leaf; parent:    5; Symbol:   32,weight     4
** MSG:   11 Internal Node; parent:   6; Child :  19,weight      3
** MSG:   12 node, is Leaf; parent:    6; Symbol:  116,weight     2
** MSG: AGroup:    2; NodeLimit:    9; NextFreeNode: 33;
** MSG: SingleSubTreeNode:   2 ;CutPointOutDegree is:    2, OutDegree is:    8
** MSG: ____1st node after the cutline in HuffmanGroup..
** MSG:    3 Internal Node; parent:   2; Child :   5,    weight    13
** MSG:    Arithm_Symbol    0 is:   42
** MSG:    Last Arithm_Symbol is a H-GROUP at location:    2
** MSG:

** MSG: Root is node 0;weight:    51
** MSG:    1 node, is Leaf; parent:    0; Symbol:   42,weight    30
** MSG:    2 Internal Node; parent:   0; Child :   3,weight     21
** MSG: ____Starts Huffman Group
** MSG:    3 Internal Node; parent:   2; Child :   5,weight     13
** MSG:    4 Internal Node; parent:   2; Child :   7,weight      8
** MSG:    5 Internal Node; parent:   3; Child :   9,weight      8
** MSG:    6 Internal Node; parent:   3; Child :  11,weight      5
** MSG:    7 Internal Node; parent:   4; Child :  13,weight      4
** MSG:    8 Internal Node; parent:   4; Child :  15,weight      4
** MSG:    9 Internal Node; parent:   5; Child :  17,weight      4
** MSG:   10 node, is Leaf; parent:    5; Symbol:   32,weight     4
** MSG:   11 Internal Node; parent:   6; Child :  19,weight      3
** MSG:   12 node, is Leaf; parent:    6; Symbol:  116,weight     2
** MSG: AGroup:    2; NodeLimit:    9; NextFreeNode: 33;
** MSG: SingleSubTreeNode:   2 ;CutPointOutDegree is:    2, OutDegree is:    8
** MSG: ____1st node after the cutline in HuffmanGroup..
** MSG:    3 Internal Node; parent:   2; Child :   5,    weight    13
** MSG:    Arithm_Symbol    0 is:   42
** MSG:    Last Arithm_Symbol is a H-GROUP at location:    2
** MSG:
```

```
** MSG: Root is node 0;weight:    52
** MSG:    1 node, is Leaf; parent:   0; Symbol:   42,weight    31
** MSG:    2 Internal Node; parent:  0; Child :   3,weight    21
** MSG: ____Starts Huffman Group
** MSG:    3 Internal Node; parent:  2; Child :   5,weight    13
** MSG:    4 Internal Node; parent:  2; Child :   7,weight     8
** MSG:    5 Internal Node; parent:  3; Child :   9,weight     8
** MSG:    6 Internal Node; parent:  3; Child :  11,weight     5
** MSG:    7 Internal Node; parent:  4; Child :  13,weight     4
** MSG:    8 Internal Node; parent:  4; Child :  15,weight     4
** MSG:    9 Internal Node; parent:  5; Child :  17,weight     4
** MSG:   10 node, is Leaf; parent:   5; Symbol:   32,weight     4
** MSG:   11 Internal Node; parent:  6; Child :  19,weight     3
** MSG:   12 node, is Leaf; parent:   6; Symbol:  116,weight     2
** MSG: AGroup:   2; NodeLimit:   9; NextFreeNode:  33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:  2; Child :   5,   weight    13
** MSG:    Arithm_Symbol    0 is:   42
** MSG:    Last Arithm_Symbol is a H-GROUP at location:   2
** MSG:

** MSG: Root is node 0;weight:    53
** MSG:    1 node, is Leaf; parent:   0; Symbol:   42,weight    32
** MSG:    2 Internal Node; parent:  0; Child :   3,weight    21
** MSG: ____Starts Huffman Group
** MSG:    3 Internal Node; parent:  2; Child :   5,weight    13
** MSG:    4 Internal Node; parent:  2; Child :   7,weight     8
** MSG:    5 Internal Node; parent:  3; Child :   9,weight     8
** MSG:    6 Internal Node; parent:  3; Child :  11,weight     5
** MSG:    7 Internal Node; parent:  4; Child :  13,weight     4
** MSG:    8 Internal Node; parent:  4; Child :  15,weight     4
** MSG:    9 Internal Node; parent:  5; Child :  17,weight     4
** MSG:   10 node, is Leaf; parent:   5; Symbol:   32,weight     4
** MSG:   11 Internal Node; parent:  6; Child :  19,weight     3
** MSG:   12 node, is Leaf; parent:   6; Symbol:  116,weight     2
** MSG: AGroup:   2; NodeLimit:   9; NextFreeNode:  33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:  2; Child :   5,   weight    13
** MSG:    Arithm_Symbol    0 is:   42
** MSG:    Last Arithm_Symbol is a H-GROUP at location:   2
** MSG:
```

```
** MSG: Root is node 0;weight:    54
** MSG:    1 node, is Leaf; parent:    0; Symbol:   42,weight    33
** MSG:    2 Internal Node; parent:   0; Child :   3,weight     21
** MSG: ____Starts Huffman Group
** MSG:    3 Internal Node; parent:   2; Child :   5,weight     13
** MSG:    4 Internal Node; parent:   2; Child :   7,weight     8
** MSG:    5 Internal Node; parent:   3; Child :   9,weight     8
** MSG:    6 Internal Node; parent:   3; Child :   11,weight    5
** MSG:    7 Internal Node; parent:   4; Child :   13,weight    4
** MSG:    8 Internal Node; parent:   4; Child :   15,weight    4
** MSG:    9 Internal Node; parent:   5; Child :   17,weight    4
** MSG:    10 node, is Leaf; parent:   5; Symbol:   32,weight    4
** MSG:    11 Internal Node; parent:  6; Child :   19,weight    3
** MSG:    12 node, is Leaf; parent:   6; Symbol:   116,weight   2
** MSG: AGroup:   2; NodeLimit:   9; NextFreeNode: 33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,    weight    13
** MSG:     Arithm_Symbol    0 is:   42
** MSG:     Last Arithm_Symbol is a H-GROUP at location:    2
** MSG:

** MSG: Root is node 0;weight:    55
** MSG:    1 node, is Leaf; parent:    0; Symbol:   42,weight    34
** MSG:    2 Internal Node; parent:   0; Child :   3,weight     21
** MSG: ____Starts Huffman Group
** MSG:    3 Internal Node; parent:   2; Child :   5,weight     13
** MSG:    4 Internal Node; parent:   2; Child :   7,weight     8
** MSG:    5 Internal Node; parent:   3; Child :   9,weight     8
** MSG:    6 Internal Node; parent:   3; Child :   11,weight    5
** MSG:    7 Internal Node; parent:   4; Child :   13,weight    4
** MSG:    8 Internal Node; parent:   4; Child :   15,weight    4
** MSG:    9 Internal Node; parent:   5; Child :   17,weight    4
** MSG:    10 node, is Leaf; parent:   5; Symbol:   32,weight    4
** MSG:    11 Internal Node; parent:  6; Child :   19,weight    3
** MSG:    12 node, is Leaf; parent:   6; Symbol:   116,weight   2
** MSG: AGroup:   2; NodeLimit:   9; NextFreeNode: 33;
** MSG: SingleSubTreeNode:   2 ;CutPointOutDegree is:   2, OutDegree is:   8
** MSG: ____1st node after the cutline in HuffmanGroup..
** MSG:    3 Internal Node; parent:   2; Child :   5,    weight    13
** MSG:     Arithm_Symbol    0 is:   42
** MSG:     Last Arithm_Symbol is a H-GROUP at location:    2
```

We claim:

1. An encoder for compressing a unit of data composed of symbols having a plurality of possible symbol values and each symbol having a frequency with which it occurs in the unit of data, comprising:
   a symbol controller which assigns symbols to an A-Group or H-Group based on the frequencies of the symbols;
   an interval controller which assigns Arithmetic subintervals to the H-Group and to the symbols in the A-Group;
   a Prefix encoder which encodes symbols in the H-Group into Prefix codewords; and
   an Arithmetic encoder which encodes the Prefix codewords and the symbols in the A-Group into an Arithmetic code stream using the assigned Arithmetic subintervals.

2. The encoder of claim 1 further comprising means for scaling the Prefix codewords to fit into the Arithmetic subinterval assigned to the H-Group.

3. The encoder of claim 1 wherein the interval controller the width of the subinterval assigned to the H-Group by the interval controller is a negative power of 2.

4. The encoder of claim 1 wherein the frequency of at least one of the symbol in the A-Group is higher than the frequency of at least one symbol in the H-Group.

5. The encoder of claim 1 wherein the symbol controller uses a Huffman tree or sibling list containing the symbols arranged by frequency to assign symbols to the A-Group or the H-Group.

6. The encoder of claim 1 wherein the symbol controller assigns symbols with a frequency exceeding a threshold value to the A-Group.

7. The encoder of claim 1 wherein the symbol controller uses a most probable symbol heap to determine which symbols to assign to the A-Group.

8. The encoder of claim 1 wherein the symbol controller assigns a predetermined number of symbols to the A-Group.

9. An encoder for compressing a unit of data composed of symbols having a plurality of possible symbol values and each symbol having a frequency with which it occurs in the unit of data, comprising:
   means for assigning the symbols to an A-Group or an H-Group based on the frequency of the symbols;
   an interval controller which assigns Arithmetic subintervals to the H-Group and to the symbols in the A-Group;
   means for encoding symbols in the H-Group into Prefix codewords; and means for encoding the Prefix codewords and symbols belonging to the A-Group into an Arithmetic code stream using the assigned subintervals.

10. The encoder of claim 9 further comprising means for scaling the Prefix codeword to fit into the assigned Arithmetic subinterval for the H-Group.

11. The encoder of claim 9 wherein the width of the Arithmetic subinterval assigned to the H-Group is a negative power of 2.

12. The encoder of claim 9 wherein the frequency of at least one symbol in the A-Group is higher than the frequency of at least one symbol in the H-Group.

13. The encoder of claim 9 wherein the means for assigning uses a Huffman tree or sibling list containing the symbols arranged by frequency to assign symbol to the A-Group or the H-Group.

14. The encoder of claim 9 wherein the means for assigning assigns symbol with a frequency exceeding a threshold value to the A-Group.

15. The encoder of claim 9 wherein the means for assigning uses a most probable symbol heap to assign symbols to the A-Group.

16. The encoder of claim 9 wherein the means for assigning assigns a predetermined number of symbols to the A-Group.

17. An article of manufacture comprising:
   a computer usable medium having computer readable program code means embodied therein for compressing a unit of data composed of symbols having a plurality of possible symbol values and each symbol having a frequency with which it occurs in the unit of data, the computer readable program code means comprising:
   computer readable program code means for assigning symbol to an A-Group or an H-Group based on the frequency of the symbol;
   interval controller means for assigning Arithmetic subintervals to the H-Group and to the symbols in the A-Group;
   computer readable program code means for encoding symbols having values in the H-Group into a Prefix codeword; and
   computer readable program code means for encoding the Prefix codewords and the symbols in the A-Group into an Arithmetic code stream.

18. The article of claim 17 further comprising computer readable program code means for scaling the Prefix code to fit into the Arithmetic subinterval assigned to the H-Group.

19. The article of claim 17 wherein the width of the subinterval assigned to the H-Group is a negative power of 2.

20. The article of claim 17 wherein the frequency of at least one symbol in the A-Group is higher than the frequency of at least one symbol in the H-Group.

21. The article of claim 17 wherein the computer readable program code means for assigning uses a Huffman tree or sibling list containing the symbols arranged by frequency to assign symbols to the A-Group or the H-Group.

22. The article of claim 17 wherein the computer readable program code means for assigning assigns symbols with a frequency exceeding a threshold to the A-Group.

23. The article of claim 17 wherein the computer readable program code means for assigning uses a most probable symbol heap to assign symbols to the A-Group.

24. The article of claim 17 wherein the computer readable program code means for assigning assigns a predetermined number of symbols to the A-Group.

25. A method for compressing a unit of data composed of symbols having a plurality of possible symbol values and each symbol value having a frequency of occurring in the unit of data, comprising the machine executed steps of:
   partioning the symbols into an A-Group or an H-Group based on the frequency of the symbols;
   assigning Arithmetic subintervals to the H-Group and to symbols in the A-Group;
   generating a Prefix codeword for each symbol in the H-Group; and
   encoding the Prefix codeword and the symbols in the A-Group into an Arithmetic code stream using the assigned subintervals.

26. The method of claim 25 further comprising scaling the Prefix codeword to fit into the subinterval assigned to the H-Group.

27. The method of claim 25 wherein the width of the subinterval assigned to the H-Group is a negative power of 2.

28. The method of claim 25 wherein the frequency of at least one symbol in the A-Group is higher than the frequency of at least one symbol in the H-Group.

29. The method of claim 25 wherein the step of partioning symbols uses a Huffman tree or sibling list containing the symbols arranged by frequency to partition the symbols into the A-Group or the H-Group.

30. The method of claim 25 wherein the partitioning step partitions symbols with a frequency exceeding a threshold into the A-Group.

31. The method of claim 25 wherein the partitioning step uses a most probably symbol heap to partition symbols into the A-Group.

32. The method of claim 25 wherein the partitioning step partitions a predetermined number of symbol into the A-Group.

33. An decoder for decompressing a coded stream of data corresponding to a unit of data composed of symbols comprising:

a symbol controller which partitions an arithmetic interval into subintervals and assigns the subintervals to symbols and a super-symbol which represents a set of symbols;

an Arithmetic decoder which decodes the coded stream into symbols and super-symbols by identifying the subintervals represented in the coded stream; and a Super-symbol decoder which converts each super-symbol into a Prefix codeword, then into a symbol.

34. The decoder of claim 33 further comprising means for de-scaling each super-symbol by multiplying by a number derived from the subinterval for the super-symbol.

35. The decoder of claim 33 wherein the width of a subinterval assigned to a super-symbol is a negative power of 2.

36. The decoder of claim 33 wherein each symbol has a frequency of occurring and the frequencies of symbols in the set corresponding to a super-symbol is lower than the frequency of at least one symbol not corresponding to a super-symbol.

37. The decoder of claim 33 wherein a Huffman tree or sibling list containing the symbols arranged by frequency is used to assign subintervals.

38. The decoder of claim 33 wherein a most probable symbol heap is used to determine which symbols correspond to the super-symbol.

39. The decoder of claim 33 wherein all symbols except for a predetermined number of symbols correspond to one or more super-symbols.

40. The decoder of claim 33 wherein the subintervals are assigned based on a table received with the coded stream of data.

41. A decoder for decompressing a coded stream of data corresponding to a unit of data composed of symbols, comprising:

means for assigning the subintervals of an arithmetic interval to symbols and at least one super-symbol which represents a set of symbols;

means for Arithmetically decoding the coded stream into symbols and super-symbols by identifying the subintervals represented in the coded stream;

means for converting the super-symbols into Prefix codewords; and means for translating the Prefix codewords into symbols.

42. The decoder of claim 41 further comprising means for de-scaling a super-symbol by multiplying by a number derived from the subinterval assigned to the super-symbol.

43. The decoder of claim 41 wherein the width of a subinterval assigned to a super-symbol is a negative power of 2.

44. The decoder of claim 41 wherein each symbol has a frequency of occurring and the frequency of at least one symbol value in the set corresponding to a super-symbol is lower than the frequency of at least one symbol not corresponding to a super-symbol.

45. The decoder of claim 41 wherein the means for assigning uses a Huffman tree or sibling list containing the symbols arranged by frequency to assign subintervals.

46. The decoder of claim 41 wherein a most probable symbol heap is used to assign symbols to the super-symbol.

47. The decoder of claim 41 wherein all symbols except for a predetermined number of symbols correspond to one or more super-symbols.

48. An article of manufacture comprising: a computer usable medium having computer readable program code means embodied therein for decompressing a coded stream of data corresponding to a unit of data composed of symbols, the computer readable program code means comprising:

computer readable program code means for assigning subintervals of an arithmetic interval to symbols and at least one super-symbol which represents a set of symbols;

computer readable program code means for Arithmetically decoding the coded stream into symbols and super-symbols by identifying the subintervals represented in the coded stream;

computer readable program code means for converting the super-symbols into Prefix codewords; and computer readable program code means for translating the Prefix codewords into symbols.

49. The article of manufacture of claim 48 further comprising computer readable program code means for de-scaling each super-symbol by multiplying by a number derived from the subinterval assigned to the super-symbol.

50. The article of manufacture of claim 48 wherein the width of a subinterval assigned to a super-symbol is a negative power of 2.

51. The article of manufacture of claim 48 wherein each symbol has a frequency of occurring and the frequencies of symbols in the set corresponding to a super-symbol is lower than the frequency of at least one symbol not corresponding to a super-symbol.

52. The article of manufacture of claim 48 wherein the computer readable program code means for assigning uses a Huffman tree or sibling list containing the symbols arranged by frequency to assign subintervals.

53. The article of manufacture of claim 48 wherein the computer readable program code means for assigning uses a most probable symbol heap to assign symbols to the super-symbol.

54. The encoder of claim 48 wherein the computer readable program code means for assigning assigns all symbols except for a predetermined number of symbols to one or more super-symbols.

55. A method for decompressing a stream of coded data corresponding to a unit of data composed of symbols, comprising the machine executed steps of:

assigning subintervals of an arithmetic interval to symbols and one or more super-symbols which represent a set of symbols;

Arithmetically decoding the stream of data into symbols and super-symbols by identifying subintervals represented by the stream of data;

converting the super-symbols into Prefix codes; and translating the Prefix codes into symbols.

56. The method of claim 55 the step of converting further comprising de-scaling each super-symbol by multiplying by a number derived from the subinterval assigned to the super-symbol.

57. The method of claim 55 wherein the width of a subinterval assigned to a super-symbol is a negative power of 2.

58. The method of claim 55 wherein each symbol has a frequency of occurring and the frequency of at least one symbol in the set corresponding to a super-symbol is lower than the frequency of at least one symbol not corresponding to a super-symbol.

59. The method of claim 55 wherein the assigning step further comprises using a Huffman tree or sibling list containing the symbols arranged by frequency to assign subintervals.

60. The decoder of claim 55 wherein all symbols except a predetermined number of symbols are assigned to one or more super-symbols.

61. A decoder for decompressing a coded stream of data corresponding to a unit of data composed of symbols, comprising:
  means for detecting whether the coded stream has been encoded using Arithmetic coding or Prefix coding;
  means for Arithmetically decoding the coded stream into symbols;
  means for translating Prefix codewords into symbols,
  means for routing the coded stream to the means for Arithmetically decoding when the detecting means detects Arithmetic coding otherwise routing the coded stream to the means for translating.

62. The decoder of claim 55 wherein the means for detecting uses escape sequences.

* * * * *